US007608948B2

(12) United States Patent
Nearhoof et al.

(10) Patent No.: US 7,608,948 B2
(45) Date of Patent: Oct. 27, 2009

(54) TOUCH SCREEN WITH SENSORY FEEDBACK

(75) Inventors: Jeremy Nearhoof, Norristown, PA (US); Gregory Altonen, Easton, PA (US); Joel S. Spira, Coopersburg, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 570 days.

(21) Appl. No.: 11/472,245

(22) Filed: Jun. 20, 2006

(65) Prior Publication Data

US 2007/0290874 A1  Dec. 20, 2007

(51) Int. Cl.
*H01H 9/54* (2006.01)
(52) U.S. Cl. ............... 307/140; 323/904; 315/292
(58) Field of Classification Search ............. 307/139, 307/140, 141.4; 315/291, DIG. 4, 362, 297, 315/292; 323/904
See application file for complete search history.

(56) References Cited

U.S. PATENT DOCUMENTS

| | | | |
|---|---|---|---|
| 4,246,494 A | | 1/1981 | Foreman et al. |
| 4,360,737 A | | 11/1982 | Leopold |
| 4,939,428 A | | 7/1990 | DePauli |
| 4,963,793 A | | 10/1990 | DePauli |
| 5,008,497 A | | 4/1991 | Asher |
| 5,118,910 A | | 6/1992 | Duhon et al. |
| 5,248,919 A | | 9/1993 | Hanna et al. |
| 5,336,979 A | | 8/1994 | Watson et al. |
| 5,399,940 A | | 3/1995 | Hanna et al. |
| 5,430,356 A | | 7/1995 | Ference et al. |
| 5,473,204 A | | 12/1995 | Temple |
| 5,485,058 A | | 1/1996 | Watson et al. |
| 5,553,296 A | * | 9/1996 | Forrest et al. ............ 713/323 |
| 6,118,435 A | * | 9/2000 | Fujita et al. ............. 345/173 |
| 6,518,957 B1 | * | 2/2003 | Lehtinen et al. .......... 345/173 |

(Continued)

FOREIGN PATENT DOCUMENTS

DE  198 47 225 A1  10/1998

(Continued)

OTHER PUBLICATIONS

Leviton Manufacturing Co., Inc., Touch Dimmer Product Listing, *Lighting Controls Product Selection Suide*, 2004, cover, pp. A42-A45, rear cover.

(Continued)

*Primary Examiner*—Albert W Paladini
(74) *Attorney, Agent, or Firm*—Ostrolenk Faber LLP

(57) ABSTRACT

A load control device for controlling the amount of power delivered to an electrical load from an AC power source provides improved sensory feedback to a user of the load control device. The load control device comprises a touch screen actuator having a touch sensitive front surface responsive to a plurality of point actuations, each characterized by a position and a force. The touch screen actuator has an output operatively coupled to a controller for providing a control signal representative of the position of the point actuation. The load control device further comprises a visual display and an audible sound generator, both responsive to the controller. The controller is operable to cause the visual display to illuminate and the audible sound generator to generate an audible sound in response to the control signal of the touch screen actuator.

96 Claims, 30 Drawing Sheets

U.S. PATENT DOCUMENTS

| | | | |
|---|---|---|---|
| 6,633,280 B1 * | 10/2003 | Matsumoto et al. | 345/173 |
| 6,750,564 B2 | 6/2004 | Cencur | |
| 6,963,040 B1 | 11/2005 | Urman | |
| 7,383,297 B1 * | 6/2008 | Atsmon et al. | 709/200 |
| 7,479,951 B2 * | 1/2009 | Kim | 345/179 |
| 2002/0067144 A1 | 6/2002 | Hoffknecht et al. | |
| 2003/0067449 A1 | 4/2003 | Yoshikawa et al. | |
| 2005/0083626 A1 | 4/2005 | Bruwer | |
| 2006/0076908 A1 | 4/2006 | Morgan et al. | |

FOREIGN PATENT DOCUMENTS

| | | |
|---|---|---|
| GB | 2 233 841 A | 1/1991 |

OTHER PUBLICATIONS

Leviton Manufacturing Co., Inc., True Touch Decora Preset Touch Dimmers *Product Specifications*, 1999, 2 pages.

Colorado vNet, *Touchpad Brochure*, not dated, 2 pages.

Colorado vNet, *Touchpad TP1-1D Data Sheet*, not dated, 8 pages.

Leviton Manufacturing Co., Inc., *Touch Point Decora Preset Touch Pat Dimmers Product Specifications*, 1999, 2 pages.

Colorado vNet, "Colorado vNet Introduces New Touchpad", *Press Release*, Sep. 7, 2005, 2 pages.

Cooper Wiring Devices, Decorator Touch Dimmers, *Cooper Wiring Devices Product Catalog*, not dated, 1 page.

Dawar Technologies, DawarTouch Resistive Touch Screens *Data Sheet*, not dated, 2 pages.

Dawar Technologies, Dawar Touch *Brochure*, not dated, 2 pages.

Search Report issued by PCT on Jan. 29, 2008 in connection with corresponding PCT application No. PCT/US2007/014312.

* cited by examiner

TOUCH SCREEN WITH SENSORY FEEDBACK

BACKGROUND OF THE INVENTION

1. Field of the Invention

The present invention relates to load control devices for controlling the amount of power delivered to an electrical load from a power source. More specifically, the present invention relates to a touch dimmer having a touch sensitive device.

2. Description of the Related Art

A conventional two-wire dimmer has two terminals: a "hot" terminal for connection to an alternating-current (AC) power supply and a "dimmed hot" terminal for connection to a lighting load. Standard dimmers use one or more semiconductor switches, such as triacs or field effect transistors (FETs), to control the current delivered to the lighting load and thus to control the intensity of the light. The semiconductor switches are typically coupled between the hot and dimmed hot terminals of the dimmer.

Smart wall-mounted dimmers include a user interface typically having a plurality of buttons for receiving inputs from a user and a plurality of status indicators for providing feedback to the user. These smart dimmers typically include a microcontroller or other processing device for providing an advanced set of control features and feedback options to the end user. An example of a smart dimmer is described in greater detail in commonly assigned U.S. Pat. No. 5,248,919, issued on Sep. 28, 1993, entitled LIGHTING CONTROL DEVICE, which is herein incorporated by reference in its entirety.

FIG. 1 is a front view of a user interface of a prior art smart dimmer switch 10 for controlling the amount of power delivered from a source of AC power to a lighting load. As shown, the dimmer switch 10 includes a faceplate 12, a bezel 14, an intensity selection actuator 16 for selecting a desired level of light intensity of a lighting load (not shown) controlled by the dimmer switch 10, and a control switch actuator 18. Actuation of the upper portion 16A of the intensity selection actuator 16 increases or raises the light intensity of the lighting load, while actuation of the lower portion 16B of the intensity selection actuator 16 decreases or lowers the light intensity. The intensity selection actuator 16 may control a rocker switch, two separate push switches, or the like. The control switch actuator 18 may control a push switch or any other suitable type of actuator and typically provides tactile and auditory feedback to a user when pressed.

The smart dimmer 10 also includes an intensity level indicator in the form of a plurality of light sources 20, such as light-emitting diodes (LEDs). Light sources 20 may be arranged in an array (such as a linear array as shown) representative of a range of light intensity levels of the lighting load being controlled. The intensity level of the lighting load may range from a minimum intensity level, which is preferably the lowest visible intensity, but which may be zero, or "full off," to a maximum intensity level, which is typically "full on." Light intensity level is typically expressed as a percentage of full intensity. Thus, when the lighting load is on, light intensity level may range from 1% to 100%.

By illuminating a selected one of the light sources 20 depending upon light intensity level, the position of the illuminated light source within the array provides a visual indication of the light intensity relative to the range when the lamp or lamps being controlled are on. For example, seven LEDs are illustrated in FIG. 1. Illuminating the uppermost LED in the array will give an indication that the light intensity level is at or near maximum. Illuminating the center LED will give an indication that the light intensity level is at about the midpoint of the range. In addition, when the lamp or lamps being controlled are off, all of the light sources 18 are illuminated at a low level of illumination, while the LED representative of the present intensity level in the on state is illuminated at a higher illumination level. This enables the light source array to be more readily perceived by the eye in a darkened environment, which assists a user in locating the switch in a dark room, for example, in order to actuate the switch to control the lights in the room, and provides sufficient contrast between the level-indicating LED and the remaining LEDs to enable a user to perceive the relative intensity level at a glance.

Touch dimmers (or "zip" dimmers) are known in the art. A touch dimmer generally includes a touch-operated input device, such as a resistive or a capacitive touch pad. The touch-operated device responds to the force and position of a point actuation on the surface of the device and in turn controls the semiconductor switches of the dimmer. An example of a touch dimmer is described in greater detail in commonly-assigned U.S. Pat. No. 5,196,782, issued Mar. 23, 1993, entitled TOUCH-OPERATED POWER CONTROL, the entire disclosure of which is hereby incorporated by reference.

FIG. 2 is a cross-sectional view of a prior art touch-operated device 30, specifically, a membrane voltage divider. A conductive element 32 and a resistive element 34 are co-extensively supported in close proximity by a spacing frame 36. An input voltage, $V_{IN}$, is applied across the resistive element 34 to provide a voltage gradient across its surface. When pressure is applied at a point 38 along the conductive element 32 (by a finger or the like), the conductive element flexes downward and electrically contacts a corresponding point along the surface of the resistive element 34, providing an output voltage, $V_{OUT}$, whose value is between the input voltage $V_{IN}$ and ground. When pressure is released, the conductive element 32 recovers its original shape and becomes electrically isolated from the resistive element 34. The touch-operated device 30 is characterized by a contact resistance $R_{CONTACT}$ between the conductive element 32 and the resistive element 34. The contact resistance $R_{CONTACT}$ is dependent upon the force of the actuation of the touch-operated device 30 and is typically substantially small for a normal actuation force.

FIG. 3 is a perspective view of a user interface of a prior art touch dimmer 40. The dimmer 40 comprises a touch-operated device 30, which is located directly behind a faceplate 42. The faceplate 42 includes a flexible area 44 located directly above the conductive element 32 of the touch-operated device 30 to permit a user to actuate the touch-operated device through the faceplate 42. A conventional phase-control dimming circuit is located within an enclosure 46 and controls the power from a source to a load in accordance with pressure applied to a selectable point on flexible area 44. The faceplate 42 may include optional markings 48, 50, 52 to indicate, respectively, the location of flexible area 44, the lowest achievable intensity level of the load, and location of a "power off" control. An optional LED array 54 provides a visual indication of intensity level of the load. When the load is a light source, there is preferably a linear relationship between the number of illuminated LEDs and the corresponding perceived light level. The flexible area 44 may optionally include a light transmissive area through which LED array 54 is visible.

Typical touch-operated devices 30 do not provide auditory or tactile feedback, such as is provided by the control switch actuator 18 of the prior art dimmer 10. When a user actuates the operational area, e.g., the flexible area 44 of the touch dimmer 40, it is desirable to provide some sort of sensory feedback to the user to inform the user that the dimmer 40 has received the input. Some prior art touch dimmers have provided visual feedback, e.g., the LED array 54, and auditory feedback via a speaker. However, prior art touch dimmers have suffered from not being able to provide an acceptable amount of sensory feedback to the user. Therefore, there is a need for a touch dimmer that provides an improved sensory feedback to a user in response an actuation of the operational area.

SUMMARY OF THE INVENTION

According to the present invention, a load control device for controlling the amount of power delivered to an electrical load from an AC power source comprises a semiconductor switch, a controller, a touch screen actuator, a visual display, and an audible sound generator. The semiconductor switch is operable to be coupled in series electrical connection between the source and the load. The semiconductor switch has a control input for controlling the semiconductor switch between a non-conductive state and a conductive state. The controller is operatively coupled to the control input of the semiconductor switch for controlling the semiconductor switch between the non-conductive state and the conductive state. The touch screen actuator has a touch sensitive front surface responsive to a plurality of point actuations. Each point actuation is characterized by a position and a force. The touch screen actuator has an output operatively coupled to the controller for providing a control signal representative of the position of the point actuation. The visual display and the audible sound generator are both responsive to the controller. The controller is operable to cause the visual display to illuminate and the audible sound generator to generate an audible sound in response to the control signal of the touch screen actuator.

According to a second embodiment of the present invention, A load control device for controlling the amount of power delivered to an electrical load from an AC power source comprises: a semiconductor switch operable to be coupled in series electrical connection between the source and the load, the semiconductor switch having a control input for controlling the semiconductor switch between a non-conductive state and a conductive state; a controller operatively coupled to the control input of the semiconductor switch for controlling the semiconductor switch between the non-conductive state and the conductive state; a touch screen actuator having a touch sensitive front surface responsive to a plurality of point actuations, each characterized by a position and a force, the touch screen actuator having an output operatively coupled to the controller for providing a first control signal in response to a first point actuation and a second control signal in response to a second point actuation; and an audible sound generator responsive to the controller. The controller is operable to cause the audible sound generator to generate a first audible sound in response to the first control signal and a second audible sound in response to the second control signal.

According to a third embodiment of the present invention, a load control device for controlling the amount of power delivered to an electrical load from an AC power source device comprises: a semiconductor switch operable to be coupled in series electrical connection between the source and the load, the semiconductor switch having a control input for controlling the semiconductor switch between a non-conductive state and a conductive state; a controller operatively coupled to the control input of the semiconductor switch for controlling the semiconductor switch between the non-conductive state and the conductive state; a touch screen actuator having a touch sensitive front surface responsive to a plurality of point actuations, each characterized by a position and a force, the touch screen actuator operable to begin providing a control signal to the controller when the magnitude of the force of each of the point actuations exceeds substantially a minimum magnitude and to cease providing the control signal when the magnitude of the force subsequently decreases below substantially the minimum magnitude of the point actuation; and an audible sound generator responsive to the controller. The controller is operable to cause the audible sound generator to generate a first audible sound in response to the control signal when the magnitude of the force of each of the point actuations exceeds substantially the minimum magnitude, and to generate a second audible sound in response to the control signal when the magnitude of the force subsequently decreases below substantially the minimum magnitude of the point actuation.

Other features and advantages of the present invention will become apparent from the following description of the invention that refers to the accompanying drawings.

DETAILED DESCRIPTION OF THE INVENTION

Figure 1:
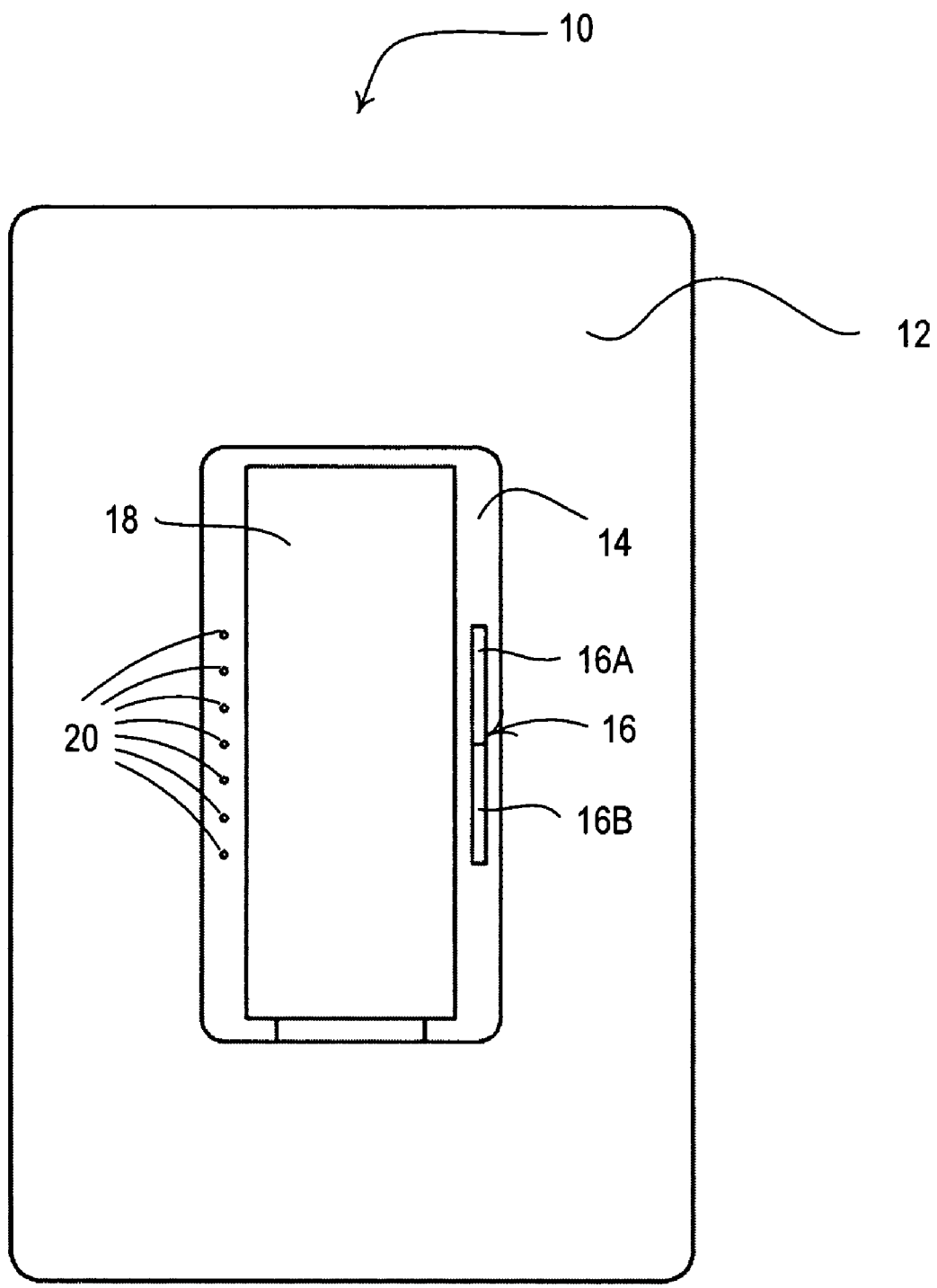
FIG. 1 is a front view of a user interface of a prior art dimmer.
Figure 2:
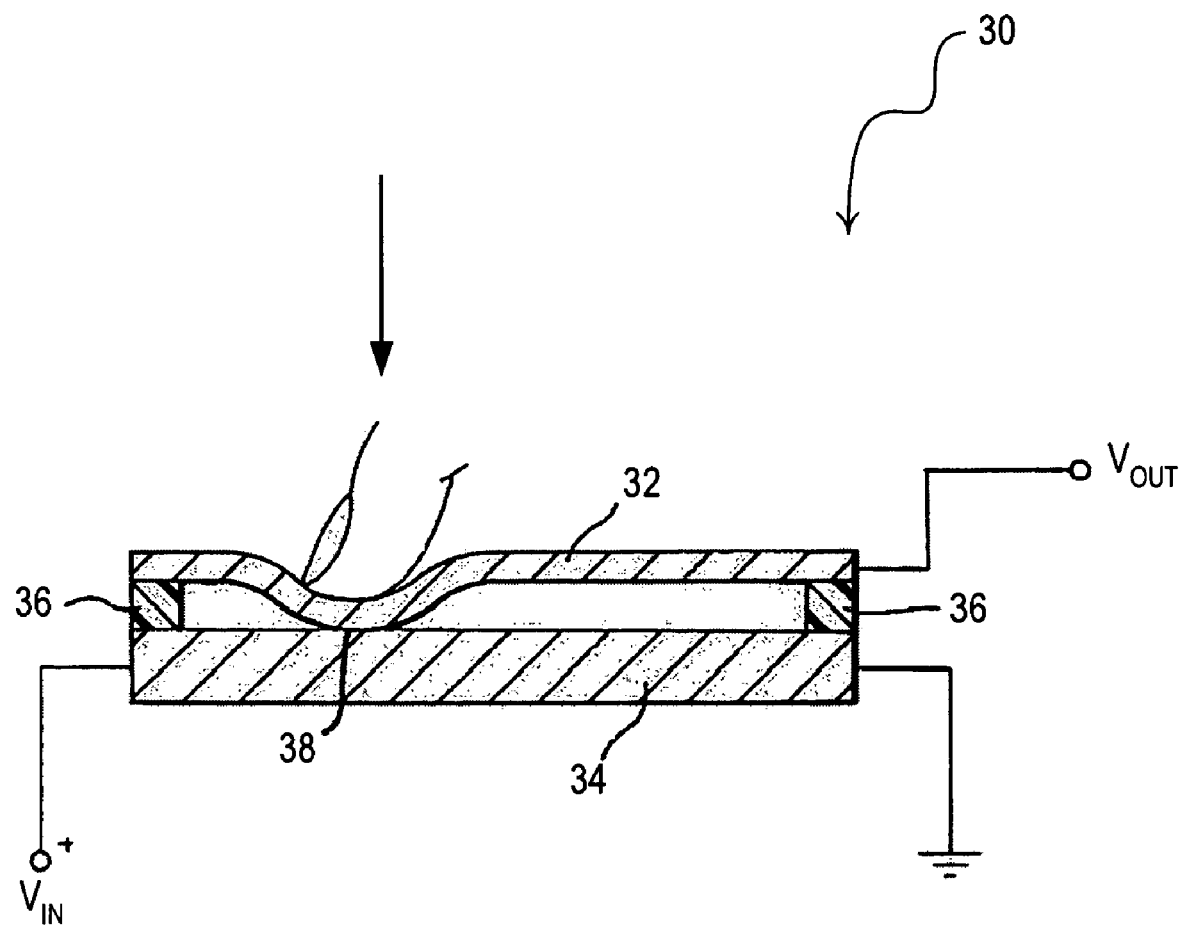
FIG. 2 is a cross-sectional view of a prior art touch-operated device.
Figure 3:
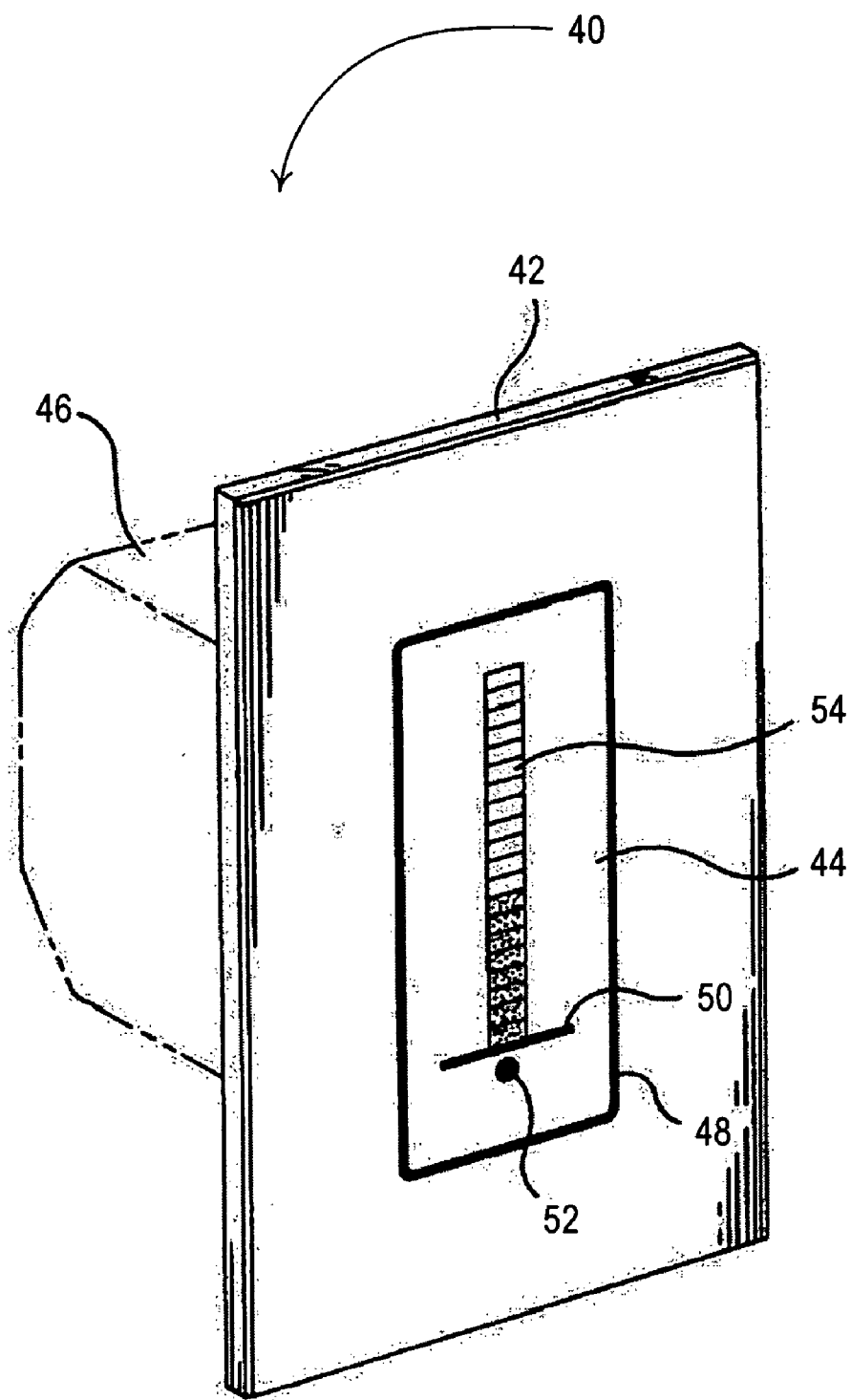
FIG. 3 is a perspective view of a user interface of a prior art touch dimmer.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

Figure 4A:
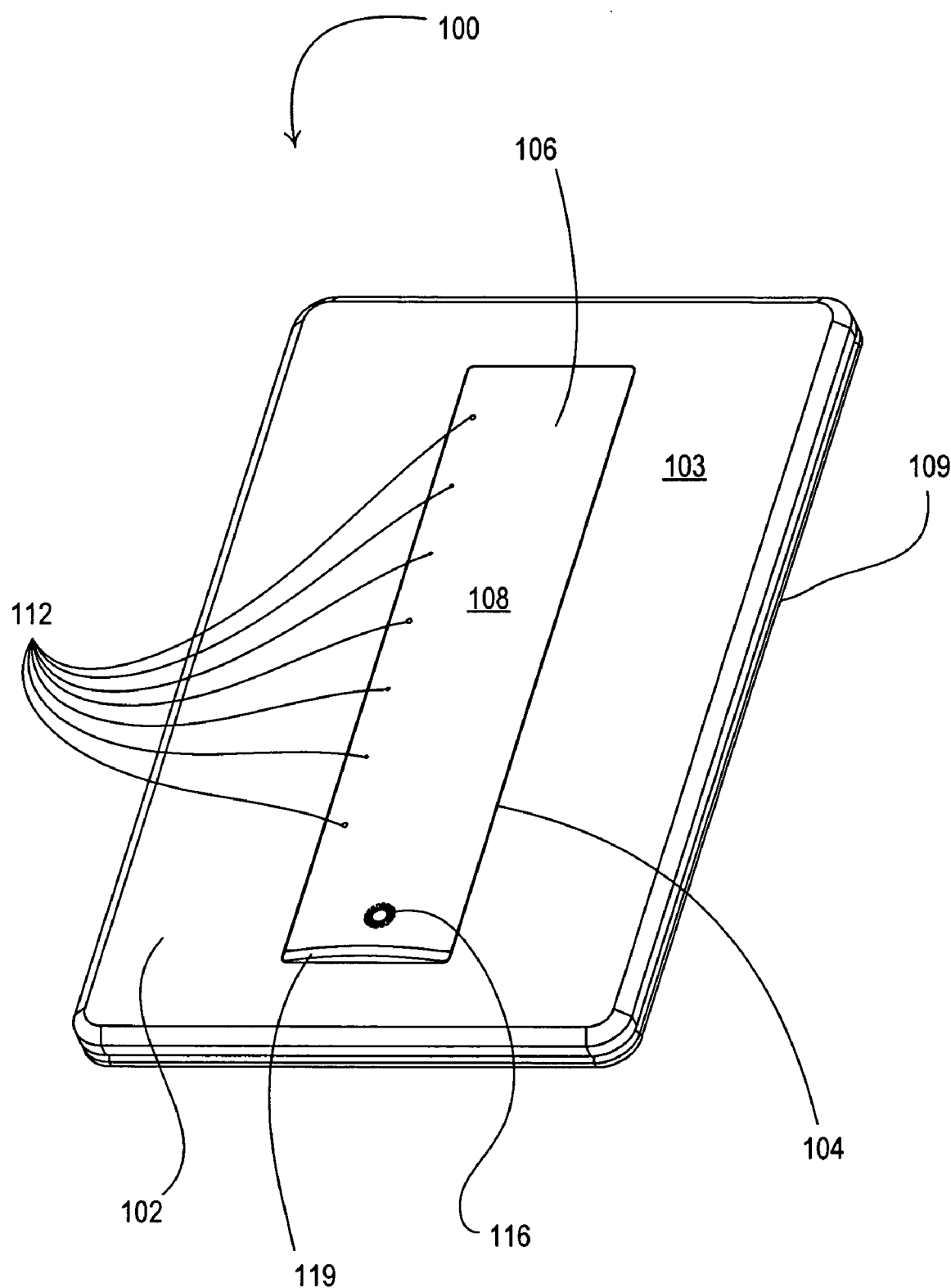
FIG. 4A is a perspective view of a touch dimmer according to the present invention.
Figure 4B:
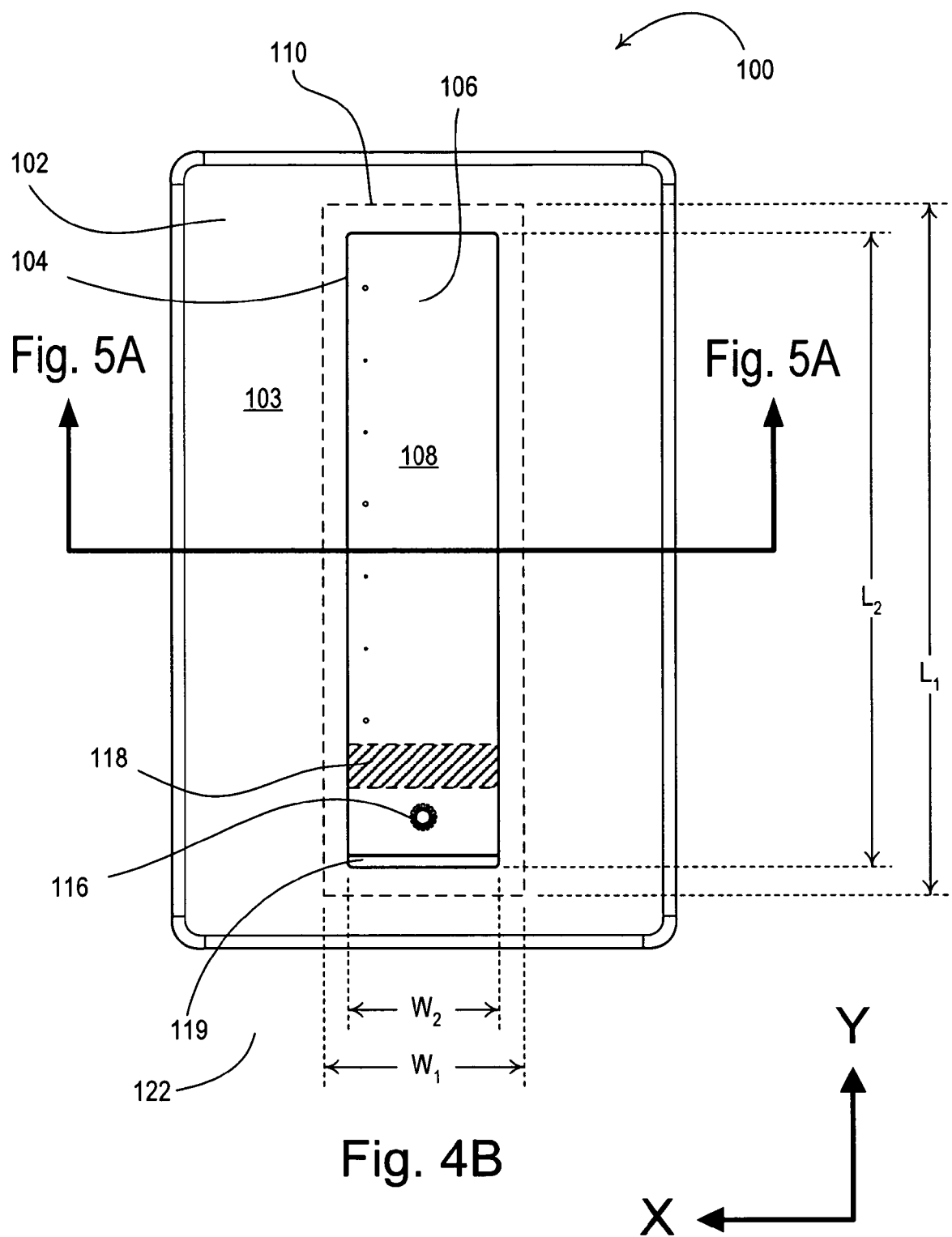
FIG. 4B is a front view of the touch dimmer of FIG. 4A.

FIGS. 4A and 4B are a perspective view and a front view, respectively, of a touch dimmer 100 according to the present invention. The dimmer 100 includes a faceplate 102, i.e., a cover plate, having a planar front surface 103 and an opening 104. The opening 104 may define a standard industry-defined opening, such as a traditional opening or a decorator opening, or another uniquely-sized opening as shown in FIG. 4A. A bezel 106 having a planar touch sensitive front surface 108 extends through the opening 104 of the faceplate 102. The front surface 108 of the bezel 106 is positioned immediately above a touch sensitive device 110 (shown in FIGS. 5A and 5B), i.e., a touch sensitive element, such that a user of the dimmer 100 actuates the touch sensitive element 110 by pressing the front surface 108 of the bezel 106. As shown in FIG. 4A, the front surface 108 of the bezel 106 is substantially flush with the front surface 103 of the faceplate 102, i.e., the plane of the front surface 108 of the bezel 106 is coplanar with the plane of the front surface 103 of the faceplate 102. However, the bezel 106 may extend through the opening 104 of the faceplate 102 such that the front surface 108 of the bezel is provided in a plane above the plane of the front surface 103 of the faceplate 102. The faceplate 102 is connected to an adapter 109, which is connected to a yoke (not shown). The yoke is adapted to mount the dimmer 100 to a standard electrical wallbox.

The dimmer 100 further comprises a visual display, e.g., a plurality of status markers 112 provided in a linear array along an edge of the front surface 108 of the bezel 106. The status markers 112 are preferably illuminated from behind by status indicators 114, e.g., light-emitting diodes (LEDs), located internal to the dimmer 100 (see FIG. 7). The dimmer 100 preferably comprises a light pipe (not shown) having a plurality of light conductors to conduct the light from the status indicators 114 inside the dimmer to the markers 112 on the front surface 108 of the bezel 106. The status indicators 114 behind the markers 112 are preferably blue. As shown in FIGS. 4A and 4B, the dimmer 100 comprises seven (7) status markers 112. However, the dimmer 100 may comprise any number of status markers. Further, the status markers 112 may be disposed in a vertical linear array along the center of the front surface 108 of the bezel 106. The markers 112 may comprise shadows apparent on the front surface 108 due to voids behind the front surface.

The front surface 108 of the bezel 106 further includes an icon 116. The icon 116 may be any sort of visual marker, such as, for example, a dot. Upon actuation of the lower portion of the front surface 108 surrounding the icon 116, the dimmer 100 causes a connected lighting load 208 (FIG. 7) to change from on to off (and vice versa), i.e., to toggle. Preferably, a blue status indicator and an orange status indicator are located immediately behind the icon 116, such that the icon 116 is illuminated with blue light when the lighting load 208 is on and illuminated with orange light when the lighting load is off. Actuation of the upper portion of the front surface 108, i.e., above the portion surrounding the icon 116, causes the intensity of the lighting load 208 to change. The status indicators 114 behind the status markers 112 are illuminated to display the intensity of the lighting load 208. For example, if the lighting load 208 is at 50% lighting intensity, the middle status indicator will be illuminated. Preferably, the dimmer 100 does not respond to actuations in a keepout region 118 of the front surface 108. The keepout region 118 prevents inadvertent actuation of an undesired portion of the front surface 108 during operation of the dimmer 100.

Figure 7:
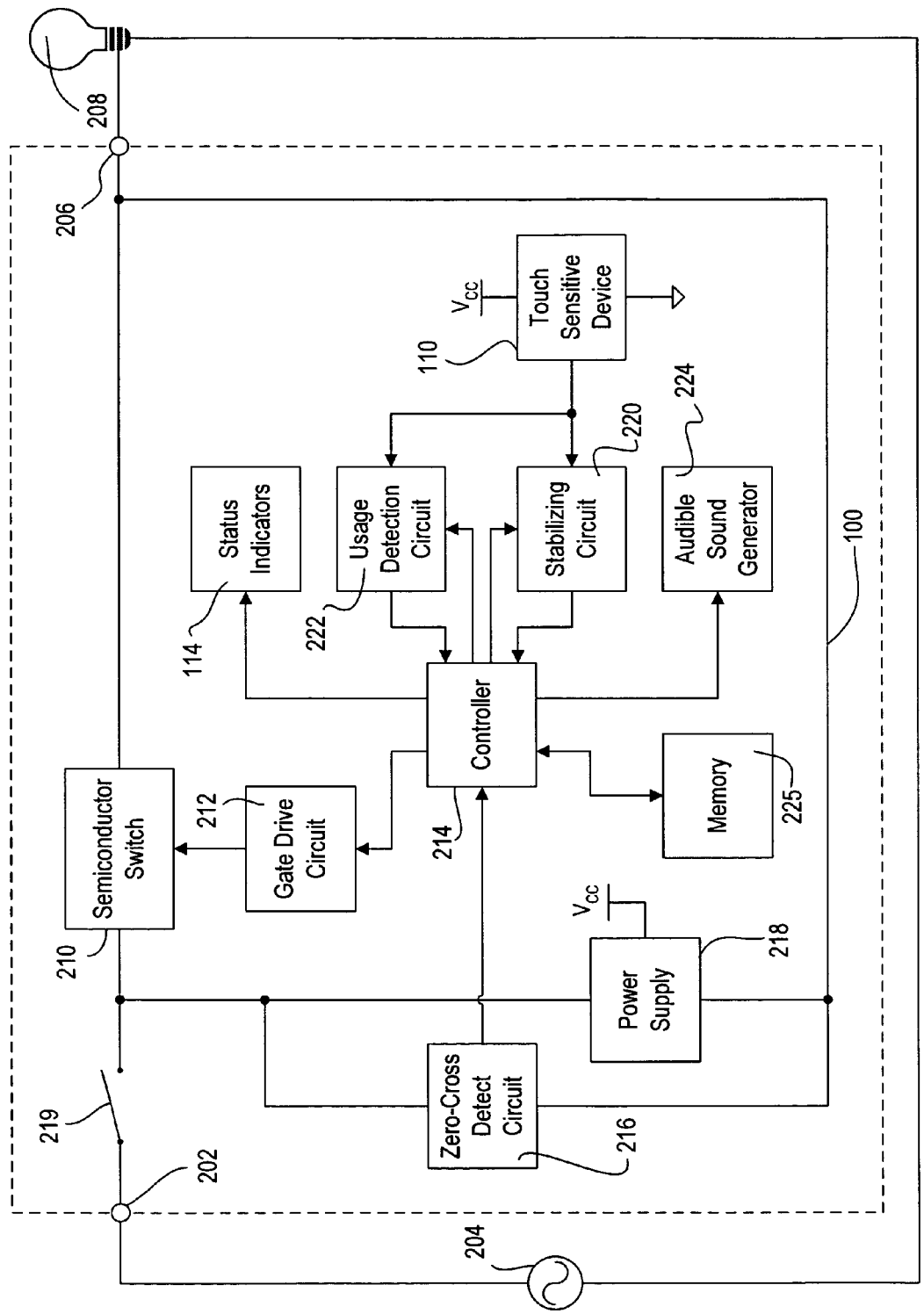
FIG. 7 is a simplified block diagram of the touch dimmer of FIG. 4A.

The dimmer 100 further includes an airgap switch actuator 119. Pulling the airgap switch actuator 119 opens a mechanical airgap switch 219 (FIG. 7) inside the dimmer 100 and disconnects the lighting load 208 from a connected AC voltage source 204 (FIG. 7). The airgap switch actuator 119 extends only sufficiently above the front surface 103 of the faceplate 102 to be gripped by a fingernail of a user. The electronic circuitry of the dimmer 100 (to be described in greater detail below) is mounted on a printed circuit board (PCB) (not shown). The PCB is housed in an enclosure (not shown), i.e., an enclosed volume, which is attached to the yoke of the dimmer 100.

Figure 5A:
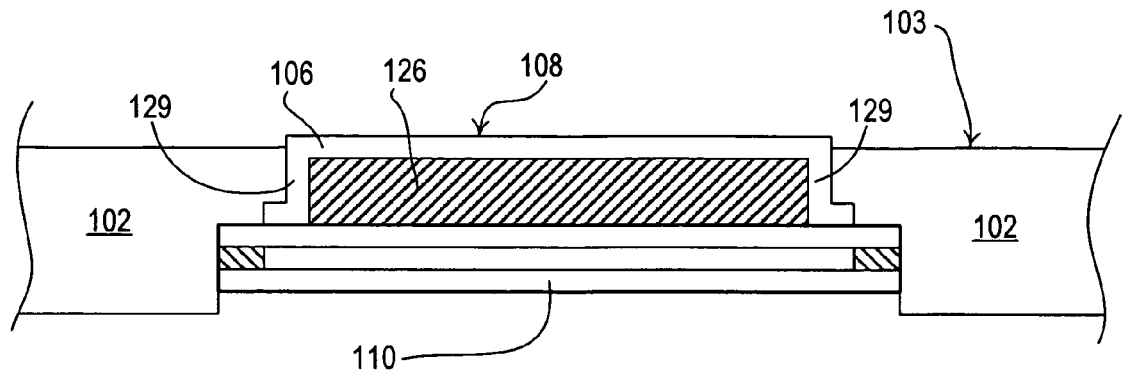
FIG. 5A is a partial assembled sectional view of a bezel and the touch sensitive device of the touch dimmer of FIG. 4A.
Figure 5B:
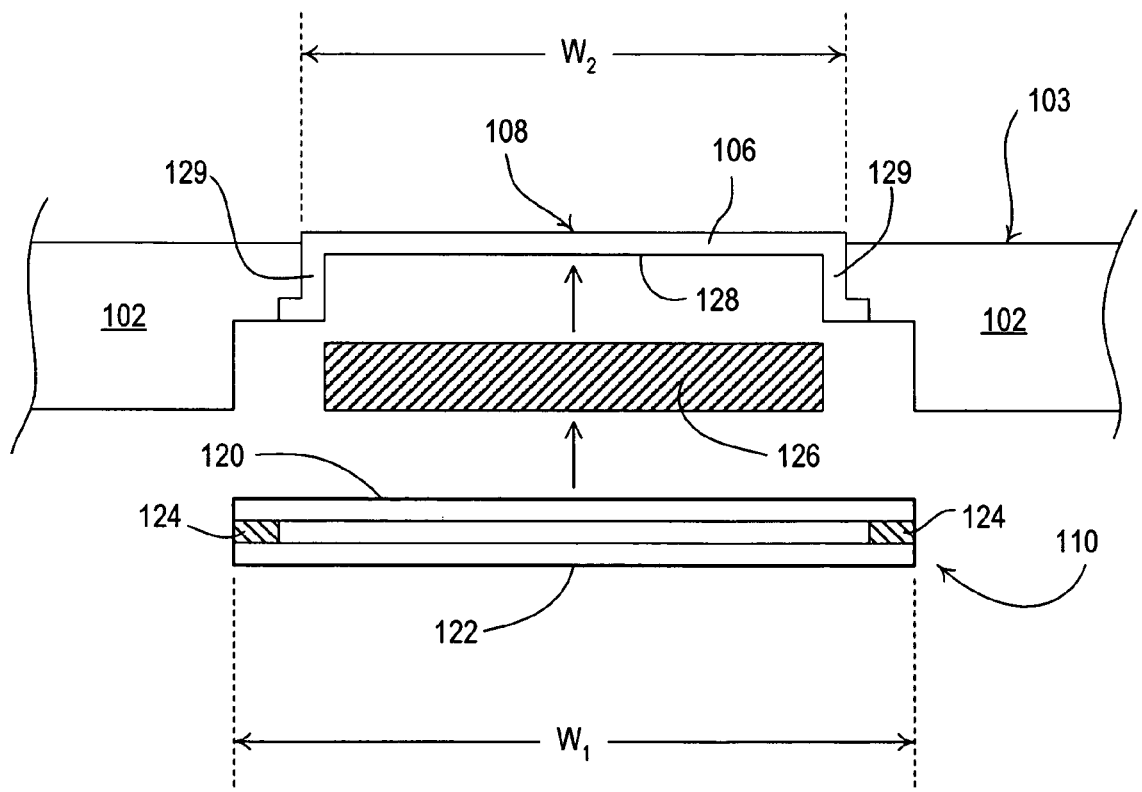
FIG. 5B is a partial exploded sectional view of the bezel and the touch sensitive device of FIG. 5A.

FIG. 5A is a partial assembled sectional view and FIG. 5B is a partial exploded sectional view of the bezel 108 and the touch sensitive device 110 of the dimmer 100 according to the present invention. The touch sensitive device 110 comprises, for example, a resistive divider, and operates in a similar fashion as the touch-operated device 30 of the prior art touch dimmer 40. The touch sensitive device 110 includes a conductive element 120 and a resistive element 122 supported by a spacing frame 124. However, the touch sensitive device 110 may comprise a capacitive touch screen or any other type of touch responsive element. Such touch sensitive devices are often referred to as touch pads or touch screens.

An elastomer 126 is received by an opening 128 in the rear surface of the bezel 106. The elastomer 126 is positioned between the bezel 106 and the touch sensitive device 110, such that a press on the front surface 108 of the bezel is transmitted to the conductive element 120 of the touch sensitive device 110. Preferably, the elastomer 126 is made of rubber and is 0.040" thick. The elastomer 126 preferably has a durometer of 40A, but may have a durometer in the range of 20A to 80A. The conductive element 120 and the resistive element 122 of the touch sensitive device 110 and the elastomer 126 are preferably manufactured from a transparent material such that the light from the plurality of status indicators 114 inside the dimmer 100 are operable to shine through the touch sensitive device 110 and the elastomer 126 to front surface 108 of the bezel 106.

Figure 6:
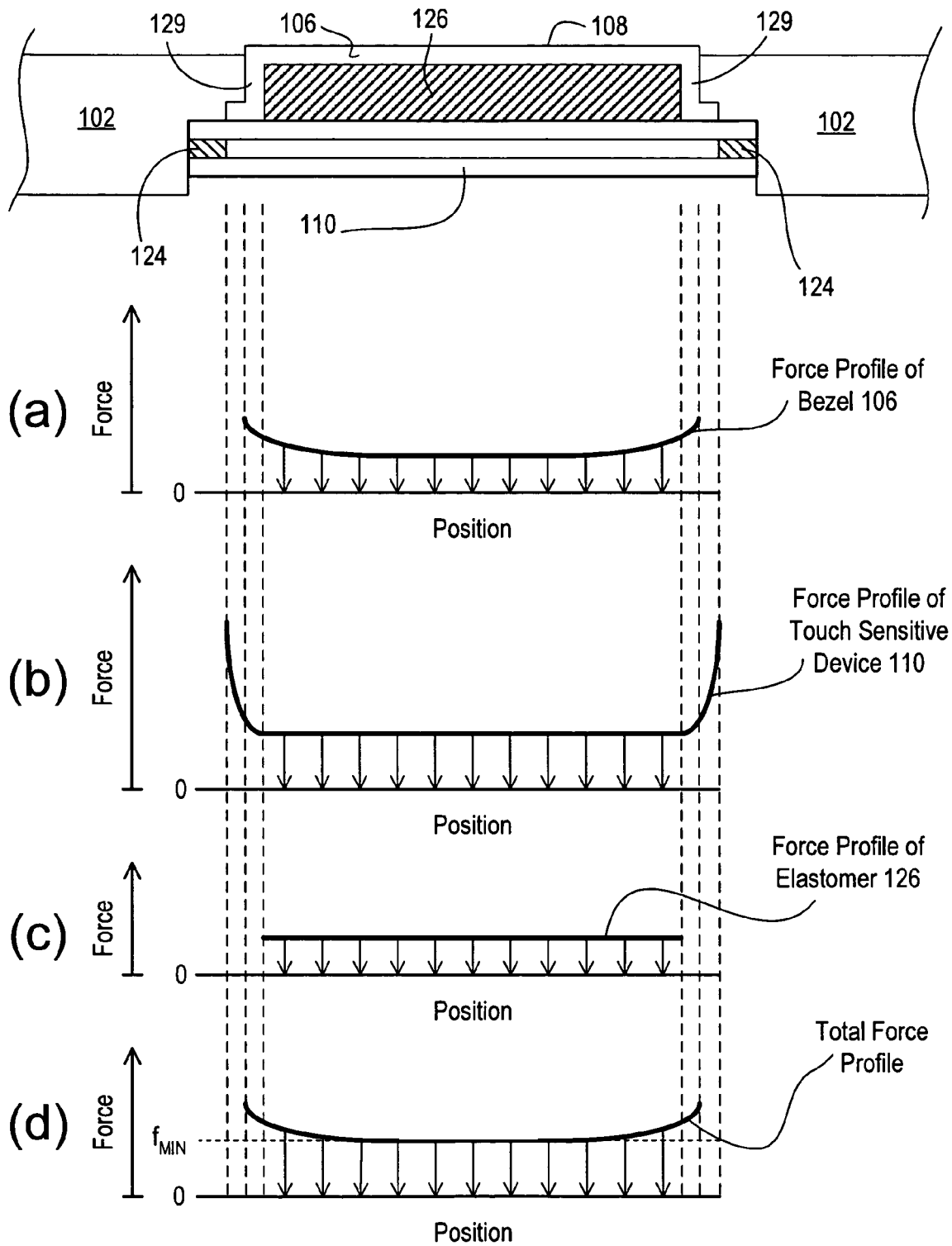
FIG. 6 shows the force profiles of the components and a cumulative force profile of the touch dimmer of FIG. 4A.

The position and size of the touch sensitive device 110 is demonstrated by the dotted line in FIG. 4B. The touch sensitive device 110 has a length $L_1$ and a width $W_1$ that is larger than a length $L_2$ and a width $W_2$ of the front surface 108 of the bezel 106. Accordingly, a first area $A_1$ of the surface of touch sensitive device 110 (i.e., $A_1=L_1 \cdot W_1$) is greater than a second area $A_2$ of the front surface 108 of the bezel 106 (i.e., $A_2=L_2 \cdot W_2$). An orthogonal projection of the second area $A_2$ onto the first area $A_1$ is encompassed by the first area $A_1$, such that a point actuation at any point on the front surface 108 of the bezel 106 is transmitted to the conductive element 120 of the touch sensitive device 110. As shown in FIGS. 4A and 4B, the length $L_2$ of the front surface 108 of the bezel 106 is approximately four (4) times greater than the width $W_2$. Preferably, the length $L_2$ of the front surface 108 of the bezel 106 is four (4) to six (6) times greater than the width $W_2$. Alternatively, the front surface 108 of the bezel 106 may be provided in an opening of a decorator-style faceplate FIG. 6 shows the force profiles of the components of the dimmer 100 shown in FIGS. 5A and 5B and a cumulative force profile for the touch sensitive device 110 of the dimmer 100. Each of the force profiles shows the force required to actuate the touch sensitive device 110 with respect to the position of the point actuation. The force profile represents the amount of force required to displace the element by a given amount. While the force profiles in FIG. 6 are shown with respect to the widths of the components of the dimmer 100, a similar force profile is also provided along the length of the components.

FIG. 6(a) shows a force profile of the bezel 106. The bezel 106 has substantially thin sidewalls 129, e.g., 0.010" thick, such that the bezel 106 exhibits a substantially flat force profile. FIG. 6(b) shows a force profile of the touch sensitive device 110. The force required to actuate the touch sensitive device 110 increases near the edges because of the spacing frames 124. FIG. 6(c) shows a force profile of the elastomer 126. The force profile of the elastomer 126 is substantially flat, i.e., a force at any point on the front surface of the elastomer 126 will result in a substantially equal force at the corresponding point on the rear surface.

FIG. 6(d) is a total force profile of the touch dimmer 100. The individual force profiles shown in FIGS. 6(a)-6(c) are additive to create the total force profile. The total force profile is substantially flat across the second area $A_2$ of the front surface 108 of the bezel 106. This means that a substantially equal minimum actuation force $f_{MIN}$ is required to actuate the touch sensitive device 110 at all points of the front surface 108 of the bezel 106, even around the edges. Accordingly, the dimmer 100 of the present invention provides a maximum operational area in an opening of a faceplate, i.e., substantially all of the second area $A_2$ of the front surface 108 of the bezel 106, which is an improvement over the prior art touch dimmers. The minimum actuation force $f_{MIN}$ is substantially equal at all points on the front surface 108 of the bezel 106. For example, the minimum actuation force $f_{MIN}$ may be 20 grams.

FIG. 7 is a simplified block diagram of the touch dimmer 100 according to the present invention. The dimmer 100 has a hot terminal 202 connected to an AC voltage source 204 and a dimmed hot terminal 206 connected to a lighting load 208.

The dimmer 100 employs a bidirectional semiconductor switch 210 coupled between the hot terminal 202 and the dimmed hot terminal 206, to control the current through, and thus the intensity of, the lighting load 208. The semiconductor switch 210 has a control input (or gate), which is connected to a gate drive circuit 212. The input to the gate renders the semiconductor switch 210 selectively conductive or non-conductive, which in turn controls the power supplied to the lighting load 208. The gate drive circuit 212 provides a control input to the semiconductor switch 210 in response to a control signal from a controller 214. The controller 214 may be any suitable controller, such as a microcontroller, a microprocessor, a programmable logic device (PLD), or an application specific integrated circuit (ASIC).

A zero-crossing detect circuit 216 determines the zero-crossing points of the AC source voltage from the AC power supply 204. A zero-crossing is defined as the time at which the AC supply voltage transitions from positive to negative polarity, or from negative to positive polarity, at the beginning of each half-cycle. The zero-crossing information is provided as an input to the controller 214. The controller 214 generates the gate control signals to operate the semiconductor switch 210 to thus provide voltage from the AC power supply 204 to the lighting load 208 at predetermined times relative to the zero-crossing points of the AC waveform. A power supply 218 generates a direct-current (DC) voltage $V_{CC}$, e.g., 5 volts, to power the controller 214 and other low voltage circuitry of the dimmer 100.

The touch sensitive device 110 is coupled to the controller 214 through a stabilizing circuit 220 and a usage detection circuit 222. The stabilizing circuit 220 is operable to stabilize the voltage output of the touch sensitive device 110. Accordingly, the voltage output of the stabilizing circuit 220 is not dependent on the magnitude of the force of the point actuation on the touch sensitive device 110, but rather is dependent solely on the position of the point actuation. The usage detection circuit 222 is operable to detect when a user is actuating the front surface 108 of the dimmer 100. The controller 214 is operable to control the operation of the stabilizing circuit 220 and the usage detection circuit 222 and to receive control signals from both the stabilizing circuit and the usage detection circuit. Preferably, the stabilizing circuit 220 has a slow response time, while the usage detection circuit 222 has a fast response time. Thus, the controller 214 is operable to control the semiconductor switch 210 in response to the control signal provided by the stabilizing circuit 220 when the usage detection circuit 222 has detected an actuation of the touch sensitive device 110.

The controller 214 is operable to drive the plurality of status indicators 114, e.g., light-emitting diodes (LEDs), which are located behind the markers 112 on the front surface 108 of the dimmer 100. The status indicators 114 also comprise the blue status indicator and the orange status indicator that are located immediately behind the icon 116. The blue status indicator and the orange status indicator may be implemented as separate blue and orange LEDs, respectively, or as a single bi-colored LED.

The dimmer 100 further comprises an audible sound generator 224 coupled to the controller 214, such that the controller is operable to cause the sound generator to produce an audible sound in response to an actuation of the touch sensitive device 110. A memory 225 is coupled to the controller 214 and is operable to store control information of the dimmer 100.

Figure 8:
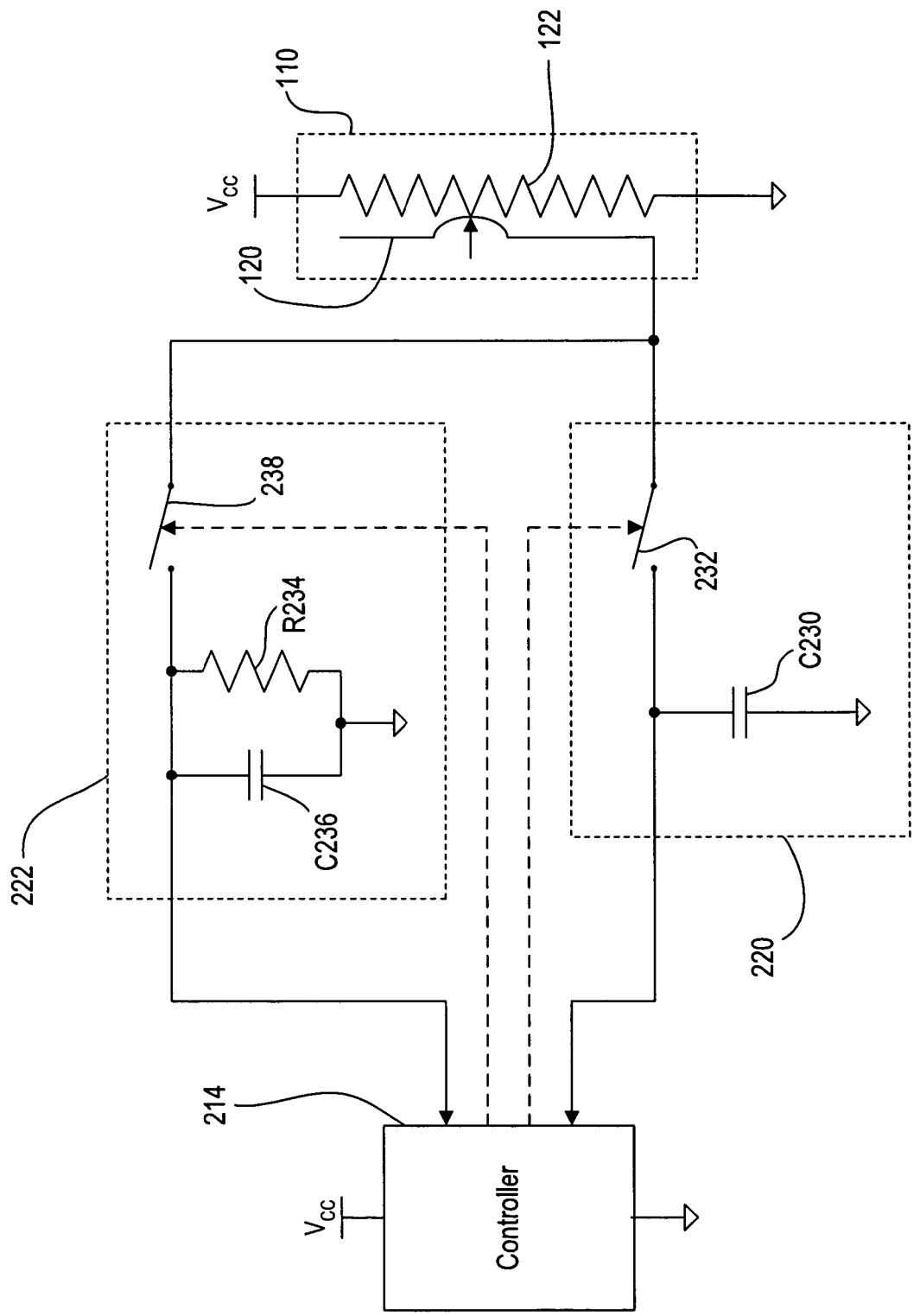
FIG. 8 is a simplified schematic diagram of a stabilizing circuit and a usage detection circuit of the touch dimmer of FIG. 7 according to a first embodiment of the present invention.

FIG. 8 is a simplified schematic diagram of the circuitry for the touch sensitive device 110 and the controller 214, i.e., the stabilizing circuit 220 and the usage detection circuit 222, according to a first embodiment of the present invention. The resistive element 122 of the touch sensitive device 110 is coupled between the DC voltage $V_{CC}$ of the power supply 218 and circuit common, such that the DC voltage $V_{CC}$ provides a biasing voltage to the touch sensitive device. The resistance of the resistive element 122 may be, for example, 7.6 kΩ. The position of contact between the conductive element 120 and the resistive element 122 of the touch sensitive device 110 is determined by the position of a point actuation on the front surface 108 of the bezel 106 of the dimmer 100. The conductive element 120 is coupled to both the stabilizing circuit 220 and the usage detection circuit 222. As shown in FIG. 7, the touch sensitive device 110 of the dimmer 100 of the first embodiment is a three-wire device, i.e., the touch sensitive device has three connections or electrodes. The touch sensitive device provides one output that is representative of the position of the point actuation along a Y-axis, i.e., a longitudinal axis of the dimmer 100 as shown in FIG. 4B.

The stabilizing circuit 220 comprises a whacking-grade capacitor C230 (that is, a capacitor having a large value of capacitance) and a first switch 232. The controller 214 is operable to control the first switch 232 between a conductive state and a non-conductive state. When the first switch 232 is conductive, the capacitor C230 is coupled to the output of the touch sensitive device 110, such that the output voltage is filtered by the capacitor C230. When a touch is present, the voltage on the capacitor C230 will be forced to a steady-state voltage representing the position of the touch on the front surface 108. When no touch is present, the voltage on the capacitor will remain at a voltage representing the position of the last touch. The touch sensitive device 110 and the capacitor C230 form a sample-and-hold circuit. The response time of the sample-and-hold circuit is determined by a resistance $R_D$ of the touch sensitive device (i.e., the resistance $R_E$ of the resistive element and a contact resistance $R_C$) and the capacitance of the capacitor C230. During typical actuation, the contact resistance $R_C$ is small compared to the value of $R_E$, such that a first charging time constant $\tau_1$, is approximately equal to $R_E \cdot C_{230}$. This time constant $\tau_1$ is preferably 13 ms, but may be anywhere between 6 ms and 15 ms.

When a light or transient press is applied to the touch sensitive device 110, the capacitor C230 will continue to hold the output at the voltage representing the position of the last touch. During the release of the touch sensitive device 110, transient events may occur that produce output voltages that represent positions other than the actual touch position. Transient presses that are shorter than the first charging time constant $\tau_1$ will not substantially affect the voltage on the capacitor C230, and therefore will not substantially affect the sensing of the position of the last actuation. During a light press, a second charging time constant $\tau_2$ will be substantially longer than during normal presses, i.e., substantially larger than the first time constant $\tau_1$, due to the higher contact resistance $R_C$. However, the steady-state value of the voltage across the capacitor C230 will be the same as for a normal press at the same position. Therefore, the output of the stabilizing circuit 220 is representative of only the position of the point of actuation of the touch sensitive device 110.

The usage detection circuit 222 comprises a resistor R234, a capacitor C236, and a second switch 238, which is controlled by the controller 214. When the switch 238 is conductive, the parallel combination of the resistor R234 and the capacitor C236 is coupled to the output of the touch sensitive device 110. Preferably, the capacitor C236 has a substantially small capacitance $C_{236}$, such that the capacitor C236 charges substantially quickly in response to all point actuations on the front surface 108. The resistor R234 allows the capacitor C236 to discharge quickly when the switch 238 is non-conductive. Therefore, the output of the usage detection circuit 222 is representative of the instantaneous usage of the touch sensitive device 110.

The controller 214 controls the switches 232, 238 in a complementary manner. When the first switch 232 is conductive, the second switch 238 is non-conductive, and vice versa. The controller 214 controls the second switch 238 to be conductive for a short period of time $t_{USAGE}$ once every half cycle of the voltage source 204 to determine whether the user is actuating the front surface 108. Preferably, the short period of time $t_{USAGE}$ is approximately 100 μsec or 1% of the half-cycle (assuming each half-cycle is 8.33 msec long). For the remainder of the time, the first switch 232 is conductive, such that the capacitor C230 is operable to charge accordingly. When the first switch 232 is non-conductive and the second switch 238 is conductive, the whacking-grade capacitor C230 of the stabilizing circuit 220 is unable to discharge at a significant rate, and thus the voltage developed across the capacitor C230 will not change significantly when the controller 214 is determining whether the touch sensitive device 110 is being actuated through the usage detection circuit 222.

Figure 9:
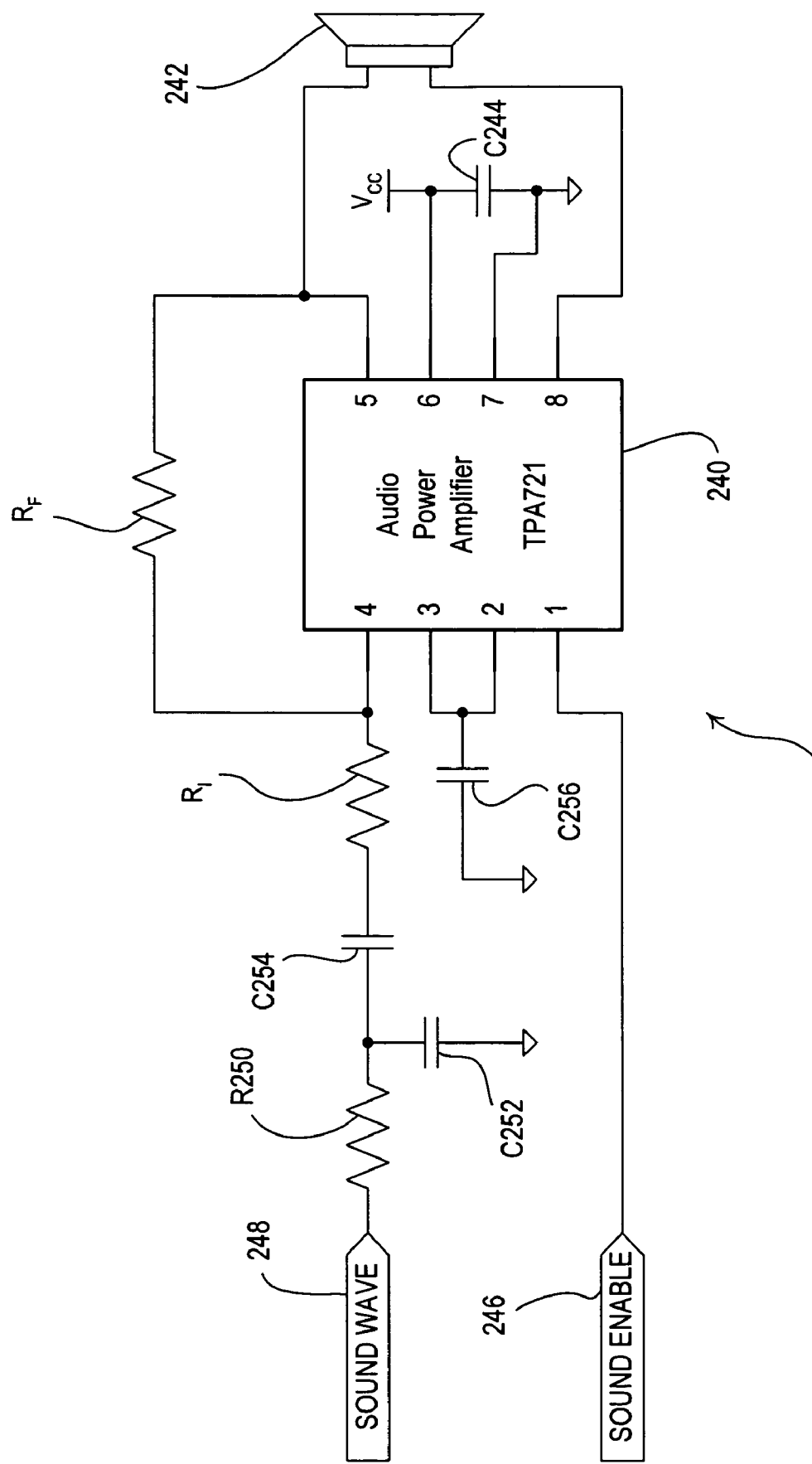
FIG. 9 is a simplified schematic diagram of an audible sound generator of the touch dimmer of FIG. 7.

FIG. 9 is a simplified schematic diagram of the audible sound generator 224 of the dimmer 100. The audible sound generator 224 uses an audio power amplifier integrated circuit (IC) 240, for example, part number TPA721 manufactured by Texas Instruments, Inc., to generate a sound from a piezoelectric or magnetic speaker 242. The amplifier IC 240 is coupled to the DC voltage $V_{CC}$ (pin 6) and circuit common (pin 7) to power the amplifier IC. A capacitor C244 (preferably having a capacitance of 0.1 μF) is coupled between the DC voltage $V_{CC}$ and circuit common to decouple the power supply voltage and to ensure the output total harmonic distortion (THD) is as low as possible.

The audible sound generator 224 receives a SOUND ENABLE signal 246 from the controller 214. The SOUND ENABLE signal 246 is provided to an enable pin (i.e., pin 1) on the amplifier IC 240, such that the audible sound generator 224 will be operable to generate the sound when the SOUND ENABLE signal is at a logic high level.

The audible sound generate 224 further receives a SOUND WAVE signal 248 from the controller 214. The SOUND WAVE signal 248 is an audio signal that is amplified by the amplifier IC 240 to generate the appropriate sound at the speaker 242. The SOUND WAVE signal 248 is first filtered by a low-pass filter comprising a resistor R250 and a capacitor C252. Preferably, the resistor R250 has a resistance of 1 kΩ and the capacitor C252 has a capacitance of 0.1 nF. The filtered signal is then passed through a capacitor C254 to produce an input signal $V_{IN}$. The capacitor C254 allows the amplifier IC to bias the input signal $V_{IN}$ to the proper DC level for optimum operation and preferably has a capacitance of 0.1 μF. The input signal $V_{IN}$ is provided to a negative input (pin 4) of the amplifier IC 240 through a input resistor $R_I$. A positive input (pin 3) of the amplifier IC 240 and with a bypass pin (pin 2) are coupled to circuit common through a bypass capacitor C256 (preferably, having a capacitance of 0.1 μF).

The output signal $V_{OUT}$ of the amplifier IC 240 is produced from a positive output (pin 5) to a negative output (pin 8) and is provided to the speaker 242. The negative input (pin 4) is coupled to the positive output (pin 5) through an output resistor $R_F$. The gain of the amplifier IC 240 is set by the input resistor $R_I$ and the feedback resistor $R_F$, i.e., $$\text{Gain} = V_{OUT}/V_{IN} = -2 \cdot (R_F/R_I).$$

Preferably, the input resistor $R_I$ and the output resistor $R_F$ both have resistances of 10 kΩ, such that the gain of the amplifier IC 240 is negative two (−2).

Figure 10:
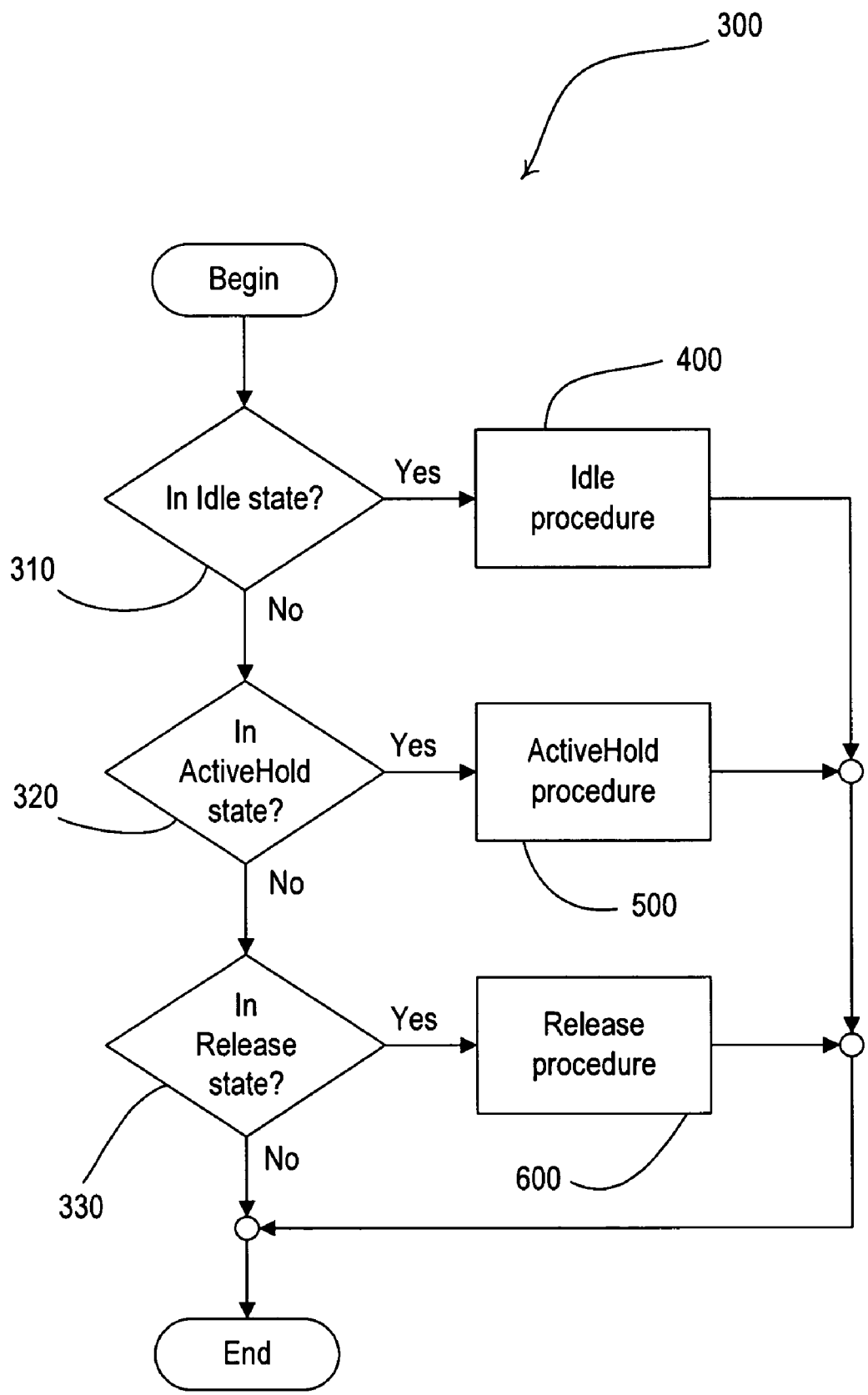
FIG. 10 is a flowchart of a touch dimmer procedure executed by a controller of the dimmer of FIG. 4A.

FIG. 10 is a flowchart of a touch dimmer procedure 300 executed by the controller 214 of the dimmer 100 according to the present invention. Preferably, the touch dimmer procedure 300 is called from the main loop of the software of the controller 214 once every half cycle of the AC voltage source 204. The touch dimmer procedure 300 selectively executes one of three procedures depending upon the state of the dimmer 100. If the dimmer 100 is in an "Idle" state (i.e., the user is not actuating the touch sensitive device 110) at step 310, the controller 214 executes an Idle procedure 400. If the dimmer 100 is in an "ActiveHold" state (i.e., the user is presently actuating the touch sensitive device 110) at step 320, the controller 214 executes an ActiveHold procedure 500. If the dimmer 100 is in a "Release" state (i.e., the user has recently ceased actuating the touch sensitive device 110) at step 330, the controller 214 executes a Release procedure 600.

Figure 11:
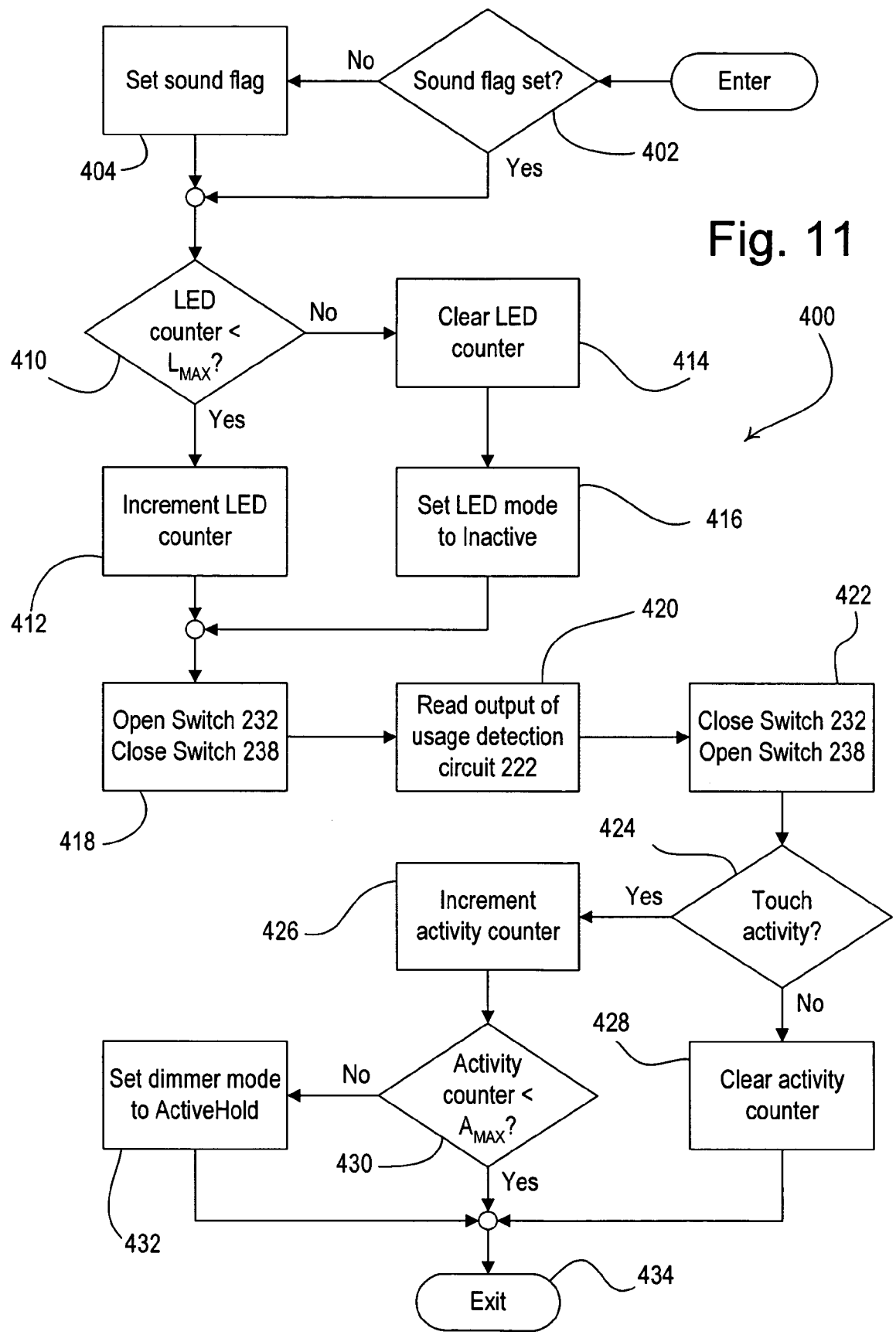
FIG. 11 is a flowchart of an Idle procedure of the touch dimmer procedure of FIG. 10.

FIG. 11 is a flowchart of the Idle procedure 400 according to the present invention. The controller 114 uses a "sound flag" and a "sound counter" to determine when to cause the audible sound generator 224 to generate the audible sound. The purpose of the sound flag is to cause the sound to be generated the first time that the controller 214 executes the ActiveHold procedure 500 after being in the Idle state. If the sound flag is set, the controller 214 will cause the sound to be generated. The sound counter is used to ensure that the controller 214 does not cause the audible sound generator 224 to generate the audible sound too often. The sound counter preferably has a maximum sound counter value $S_{MAX}$, e.g., approximately 425 msec. Accordingly, there is a gap of approximately 425 msec between generations of the audible sound. The sound counter is started during the Release procedure 600 as will be described in greater detail below. Referring to FIG. 11, upon entering the Idle state, the controller 214 sets the sound flag at step 404 if the sound flag is not set at step 402.

An "LED counter" and an "LED mode" are used by the controller 214 to control the status indicators 114 (i.e., the LEDs) of the dimmer 100. The controller 214 uses the LED counter to determine when a predetermined time $t_{LED}$ has expired since the touch sensitive device 110 was actuated. When the predetermined time $t_{LED}$ has expired, the controller 214 will change the LED mode from "active" to "inactive". When the LED mode is "active", the status indicators 114 are controlled such that one or more of the status indicators are illuminated to a bright level. When the predetermined time $t_{LED}$ expires, the LED mode is changed to "inactive", i.e., the status indicators 114 are controlled such that one or more of the status indicators are illuminated to a dim level. Referring to FIG. 11, if the LED counter is less than a maximum LED counter value $L_{MAX}$ at step 410, the LED counter is incremented at step 412 and the process moves on to step 418. However, if the LED counter is not less than the maximum LED counter value $L_{MAX}$, the LED counter is cleared at step 414 and the LED mode is set to inactive at step 416. Since the touch dimmer procedure 300 is executed once every half cycle, the predetermined time $t_{LED}$ is preferably equal to $$t_{LED} = T_{HALF} \cdot L_{MAX},$$

where $T_{HALF}$ is the period of a half cycle.

Next, the controller 214 reads the output of the usage detection circuit 222 to determine if the touch sensitive device 110 is being actuated. Preferably, the usage detection circuit 222 is monitored once every half cycle of the voltage source 204. At step 418, the controller 214 opens switch 232 and closes switch 238 to couple the resistor R234 and the capacitor C236 to the output of the touch sensitive device 110. The controller 214 determines the DC voltage of the output of the usage detection circuit 222 at step 420, preferably, by using an analog-to-digital converter (ADC). Next, the controller 214 closes switch 232 and opens switch 238 at step 422.

At step 424, if there is activity on the front surface 108 of the dimmer 100, i.e., if the DC voltage determined at step 420 is above a predetermined minimum voltage threshold, then an "activity counter" is incremented at step 426. Otherwise, the activity counter is cleared at step 428. The activity counter is used by the controller 214 to determine if the DC voltage determined at step 420 is the result of a point actuation of the touch sensitive device 110 rather than noise or some other undesired impulse. The use of the activity counter is similar to a software "debouncing" procedure for a mechanical switch, which is well known in the art. If the activity counter is not less than a maximum activity counter value $A_{MAX}$ at step 430, then the dimmer state is set to the ActiveHold state at step 432. Otherwise, the process simply exits at step 434.

Figure 12A:
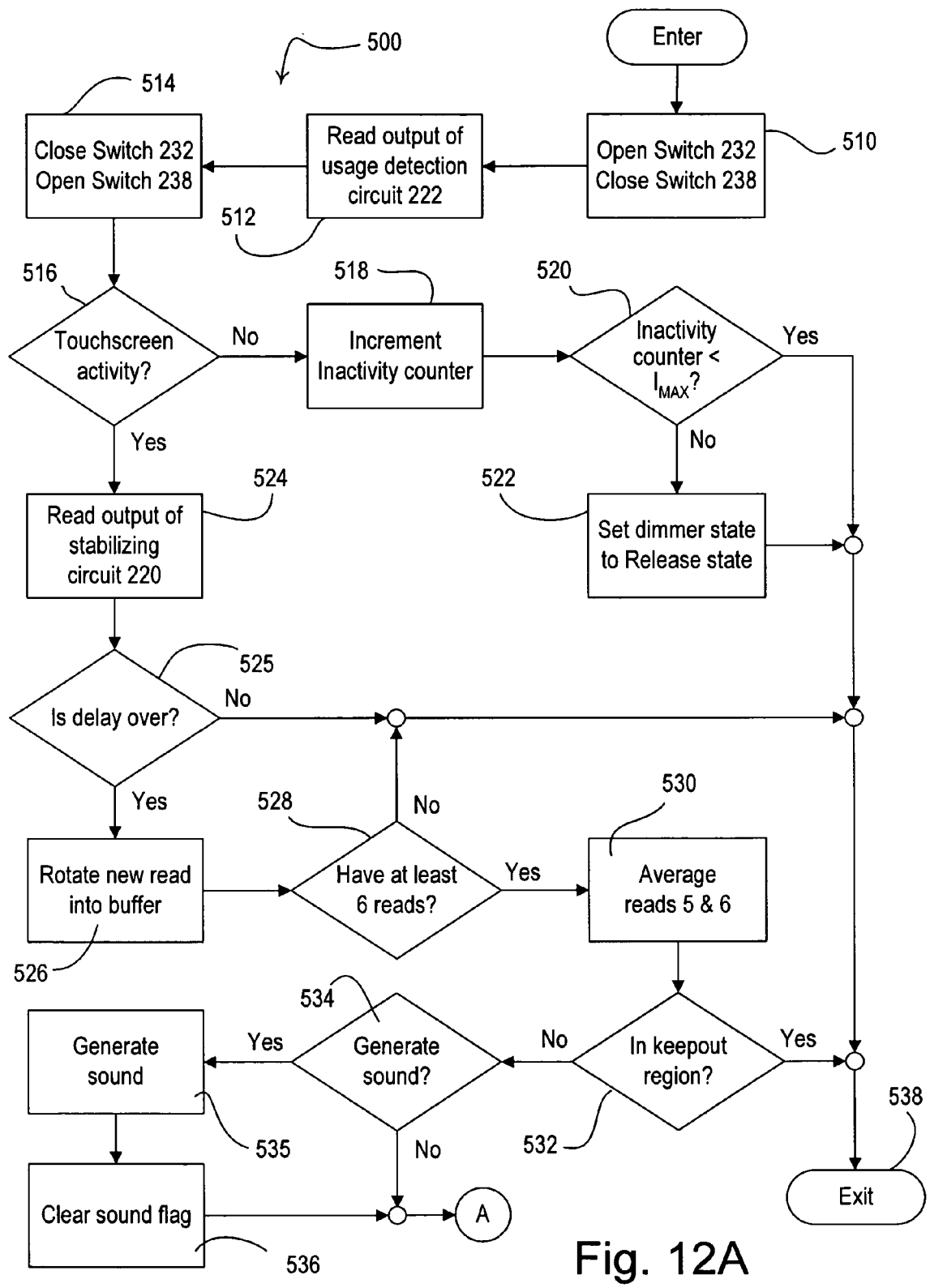
FIGS. 12A and 12B are flowcharts of an ActiveHold procedure of the touch dimmer procedure of FIG. 10.
Figure 12B:
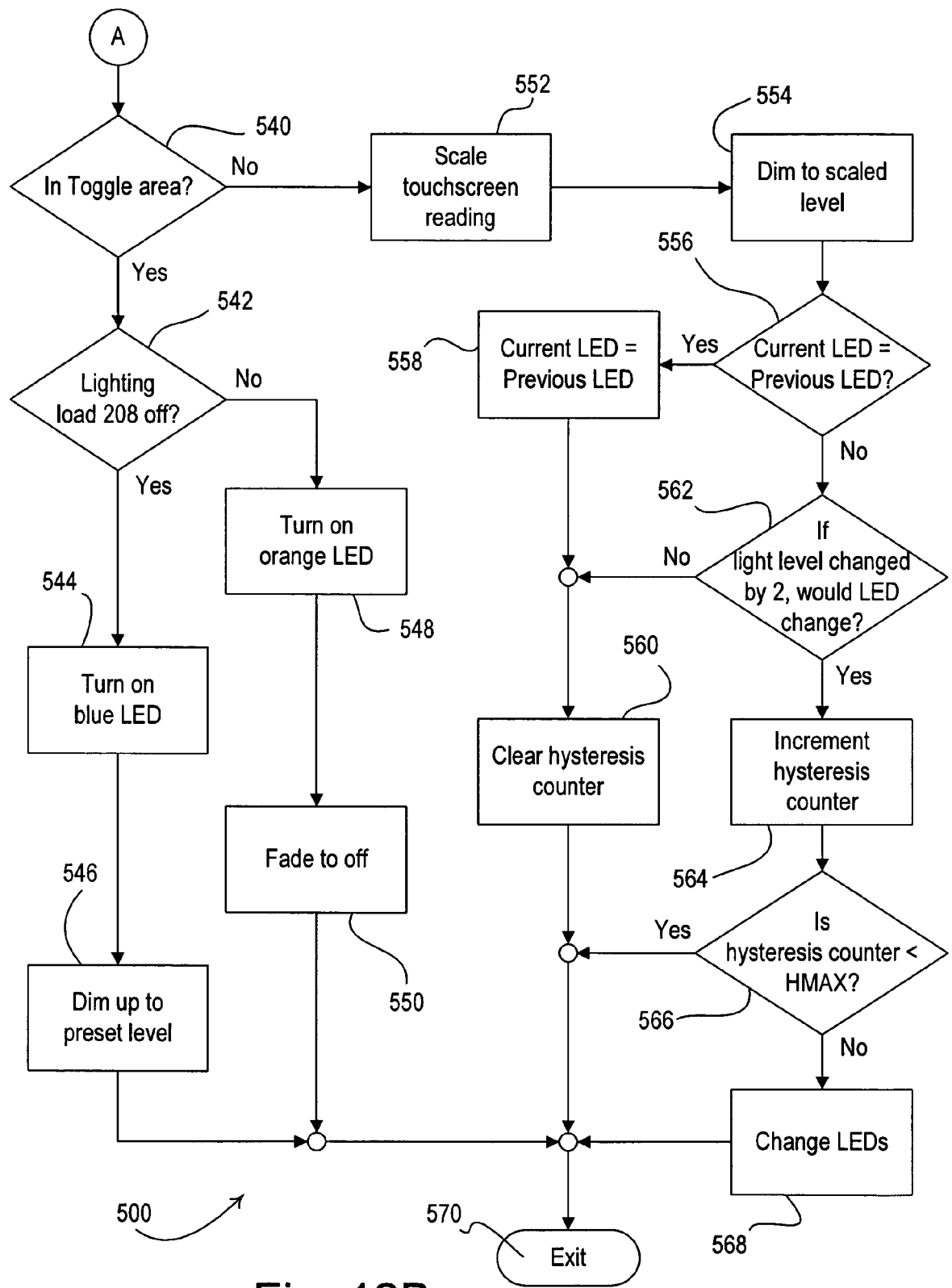

FIGS. 12A and 12B are flowcharts of the ActiveHold procedure 500, which is executed once every half cycle when the touch sensitive device 110 is being actuated, i.e., when the dimmer 100 is in the ActiveHold state. First, a determination is made as to whether the user has stopped using, i.e., released, the touch sensitive device 110. The controller 214 opens switch 232 and closes switch 238 at step 510, and reads the output of the usage detection circuit 222 at step 512. At step 514, the controller 214 closes switch 232 and opens switch 238. If there is no activity on the front surface 108 of the dimmer 100 at step 516, the controller 214 increments an "inactivity counter" at step 518. The controller 214 uses the inactivity counter to make sure that the user is not actuating the touch sensitive device 110 before entering the Release mode. If the inactivity counter is less than a maximum inactivity counter value $I_{MAX}$ at step 520, the process exits at step 538. Otherwise, the dimmer state is set to the Release state at step 522, and then the process exits.

If there is activity on the touch sensitive device 110 at step 516, the controller 214 reads the output of the stabilizing circuit 220, which is representative of the position of the point actuation on the front surface 108 of the dimmer 100. Since the switch 232 is conductive and the switch 238 is non-conductive, the controller 214 determines the DC voltage at the output of the stabilizing circuit 220, preferably using an ADC, at step 524.

Next, the controller 214 uses a buffer to "filter" the output of stabilizing circuit 220. When a user actuates the touch sensitive device 110, the capacitor C230 will charge to approximately the steady-state voltage representing the position of the actuation on the front surface 108 across a period of time determined by the first time constant $\tau_1$ as previously described. Since the voltage across the capacitor C230, i.e., the output of the stabilizing circuit 220, is increasing during this time, the controller 214 delays for a predetermined period of time at step 525, preferably, for approximately three (3) half cycles.

When a user's finger is removed from the front surface 108 of the bezel 106, subtle changes in the force and position of the point actuation occur, i.e., a "finger roll-off" event occurs. Accordingly, the output signal of the touch sensitive device 110 is no longer representative of the position of the point actuation. To prevent the controller 214 from processing reads during a finger roll-off event, the controller 214 saves the reads in the buffer and processes the reads with a delay, e.g., six half cycles later. Specifically, when the delay is over at step 525, the controller 214 rotates the new read (i.e., from step 524) into the buffer at step 526. If the buffer has at least six reads at step 528, the controller 214 averages the reads in the fifth and sixth positions in the buffer at step 530 to produce the touch position data. In this way, when the user stops actuating the touch sensitive device 110, the controller 214 detects this change at step 516 and sets the dimmer state to the Release state at step 522 before the controller processes the reads saved in the buffer near the transition time of the touch sensitive device.

At step 532, the controller 114 determines if the touch position data from step 530 is in the keepout region 118 (as shown in FIG. 4B). If the touch position data is in the keepout region 118, the ActiveHold procedure 500 simply exits at step 538. Otherwise, a determination is made at step 534 as to whether the sound should be generated. Specifically, if the sound flag is set and if the sound counter has reached a maximum sound counter value $S_{MAX}$, the controller 214 drives the SOUND ENABLE signal 246 high and provides the SOUND WAVE signal 248 to the audible sound generator 224 to generate the sound at step 535. Further, the sound flag is cleared at step 536 such that the sound will not be generated as long as the dimmer 100 remains in the ActiveHold state.

If the touch position data is in the toggle area, i.e., the lower portion of the front surface 108 of the bezel 106 surrounding the icon 116 (as shown in FIG. 4A), at step 540, the controller 214 processes the actuation of the touch sensitive device 110 as a toggle. If the lighting load 208 is presently off at step 542, the controller 214 turns the lighting load on. Specifically, the controller 214 illuminates the icon 116 with the blue status indicator at step 544 and dims the lighting load 208 up to the preset level, i.e., the desired lighting intensity of the lighting load, at step 546. If the lighting load is presently on at step 542, the controller 214 turns on the orange status indicator behind the icon 116 at step 548 and fades the lighting load 208 to off at step 550.

If the touch position data is not in the toggle area at step 540, the controller 214 scales the touch position data at step 552. The output of the stabilizing circuit 220 is a DC voltage between a maximum value, i.e., substantially the DC voltage $V_{CC}$, and a minimum value, which corresponds to the DC voltage providing by the touch sensitive device 110 when a user is actuating the lower end of the upper portion of the front surface 108 of the bezel 106. The controller 214 scales this DC voltage to be a value between off (i.e., 1%) and full intensity (i.e., 100%) of the lighting load 208. At step 554, the controller 214 dims the lighting load 208 to the scaled level produced in step 552.

Next, the controller 214 changes the status indicators 114 located behind the markers 112 on the front surface 108 of the bezel 106. As a user actuates the touch sensitive device 110 to change intensity of the lighting load 208, the controller 214 decides whether to change the status indicator 114 that is presently illuminated. Since there are seven (7) status indicators to indicate an intensity between 1% and 100%, the controller 214 may illuminate the first status indicator, i.e., the lowest status indicator, to represent an intensity between 1% and 14%, the second status indicator to represent an intensity between 15% and 28%, and so on. The seventh status indicator, i.e., the highest status indicator, may be illuminated to represent an intensity between 85% and 100%. Preferably, the controller 214 uses hysteresis to control the status indicators 114 such that if the user actuates the front surface 108 at a boundary between two of the regions of intensities described above, consecutive status indicators do not toggle back and forth.

Referring to FIG. 12B, a determination is made as to whether a change is needed as to which status indicator is illuminated at step 556. If the present LED (in result to the touch position data from step 530) is the same as the previous LED, then no change in the LED is required. The present LED is set the same as the previous LED at step 558, a hysteresis counter is cleared at step 560, and the process exits at step 570.

If the present LED is not the same as the previous LED at step 556, the controller 214 determines if the LED should be changed. Specifically, at step 562, the controller 214 determines if present LED would change if the light level changed by 2% from the light level indicated by the touch position data. If not, the hysteresis counter is cleared at step 560 and the process exits at step 570. Otherwise, the hysteresis counter is incremented at step 564. If the hysteresis counter is less than a maximum hysteresis counter value $H_{MAX}$ at step 566, the process exits at step 570. Otherwise, the LEDs are changed accordingly based on the touch position data at step 568.

Figure 13:
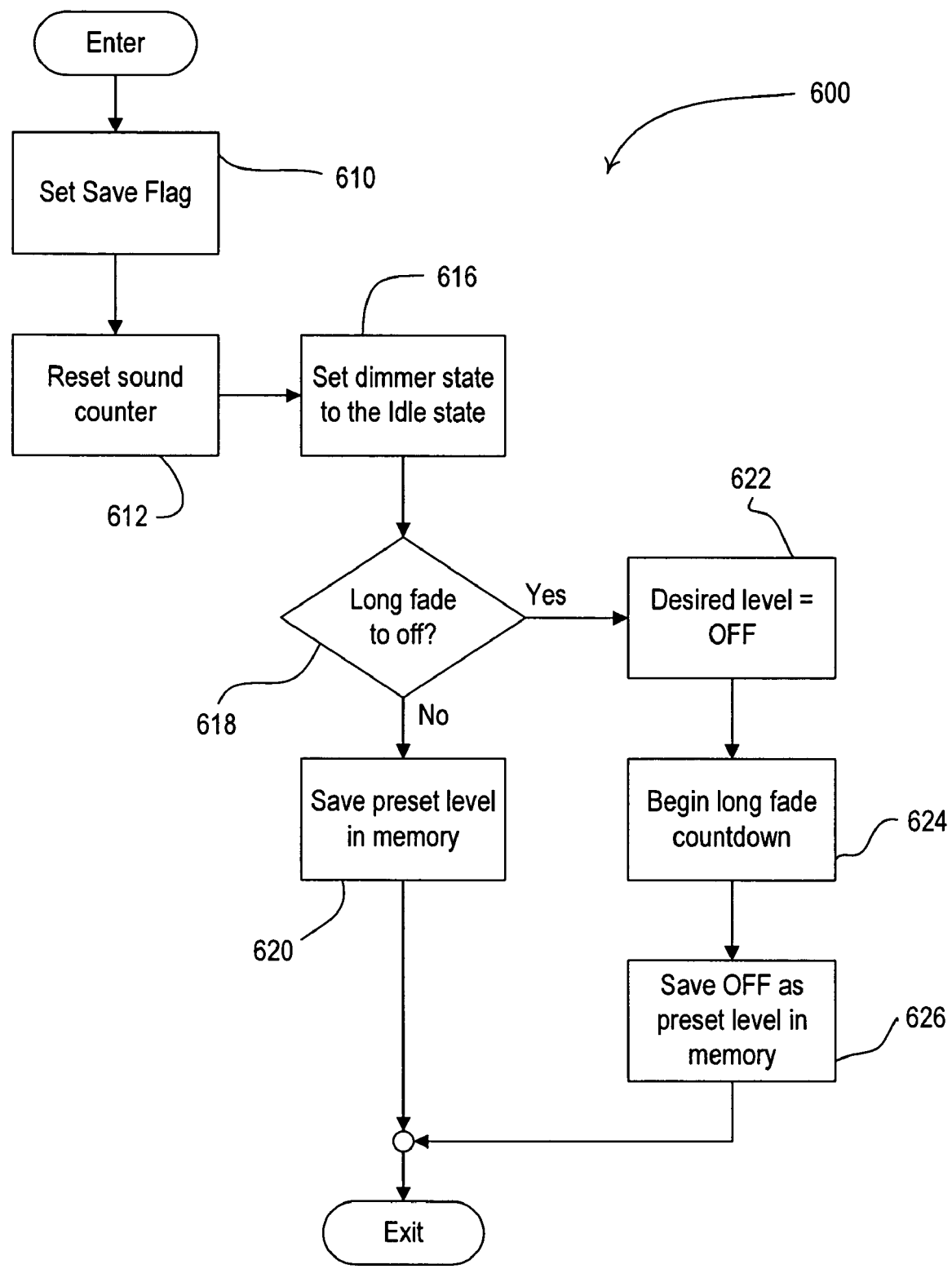
FIG. 13 is a flowchart of a Release procedure of the touch dimmer procedure of FIG. 10.

FIG. 13 is a flowchart of the Release procedure 600, which is executed after the controller 214 sets the dimmer state to the Release state at step 522 of the ActiveHold procedure 500. First, a save flag is set at step 610. Next, the sound counter is reset at step 612 to ensure that the sound will not be generated again, e.g., for preferably 18 half cycles. At step 618, a determination is made as to whether the dimmer 100 is presently executed a fade-to-off. If not, the present level is saved as the preset level in the memory 225 at step 620. Otherwise, the desired lighting intensity is set to off at step 622, the long fade countdown in started at step 624, and the preset level is saved as off in the memory 225.

Alternatively, the controller 214 could cause the audible sound generator 224 to generate different sounds in response to different presses of the touch sensitive device. For example, the audible sound generator could produce a first sound in response to a toggle event, i.e., an actuation of the lower portion of the front surface 108 of the bezel 106 surrounding the icon 116, and a second sound in response to a change intensity event, i.e., an actuation of the upper portion of the front surface 108 of the bezel 106.

Figure 14A:
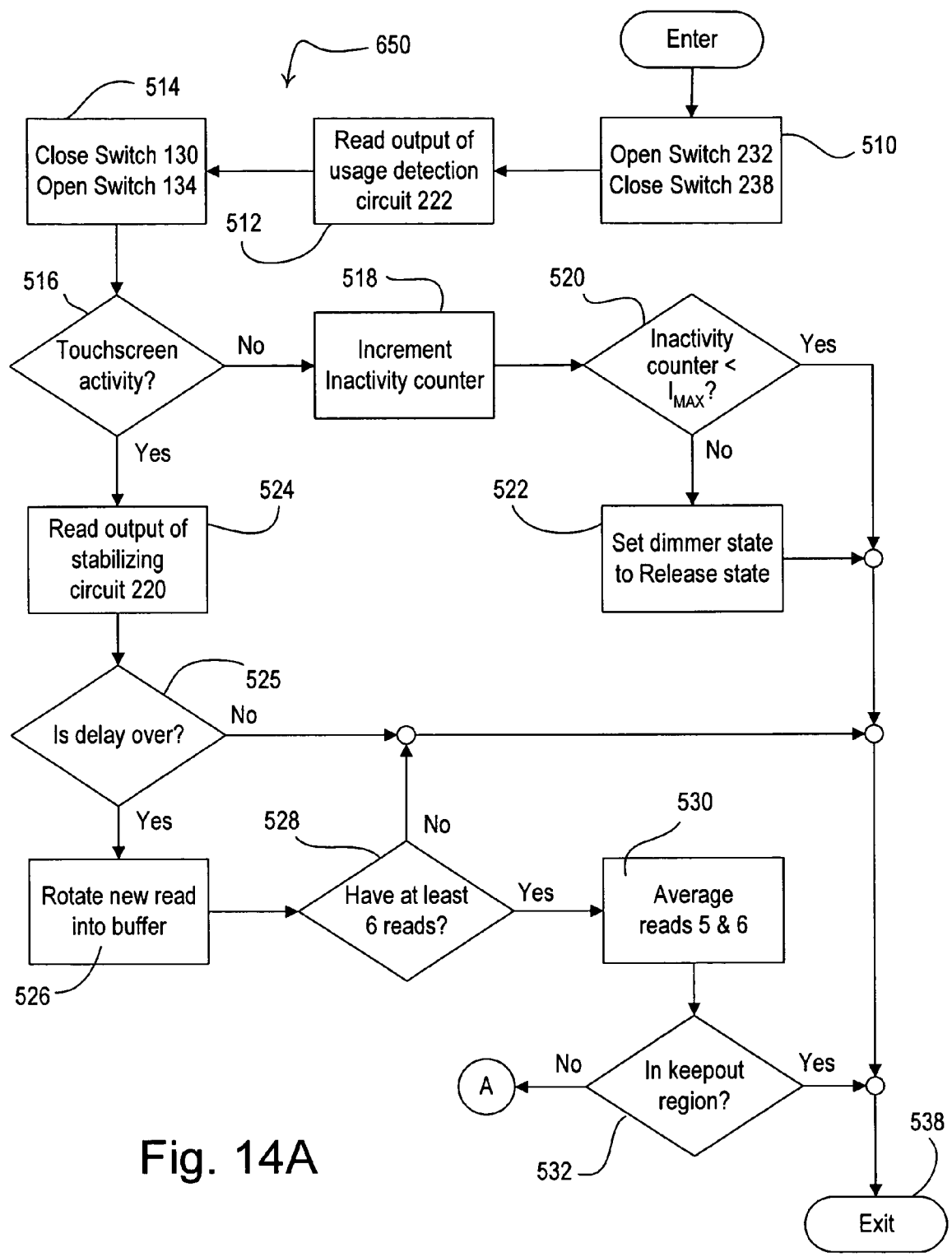
FIGS. 14A and 14B are flowcharts of an ActiveHold procedure for generating a first sound and a second sound in response to a toggle event and a change intensity event, respectively.
Figure 14B:
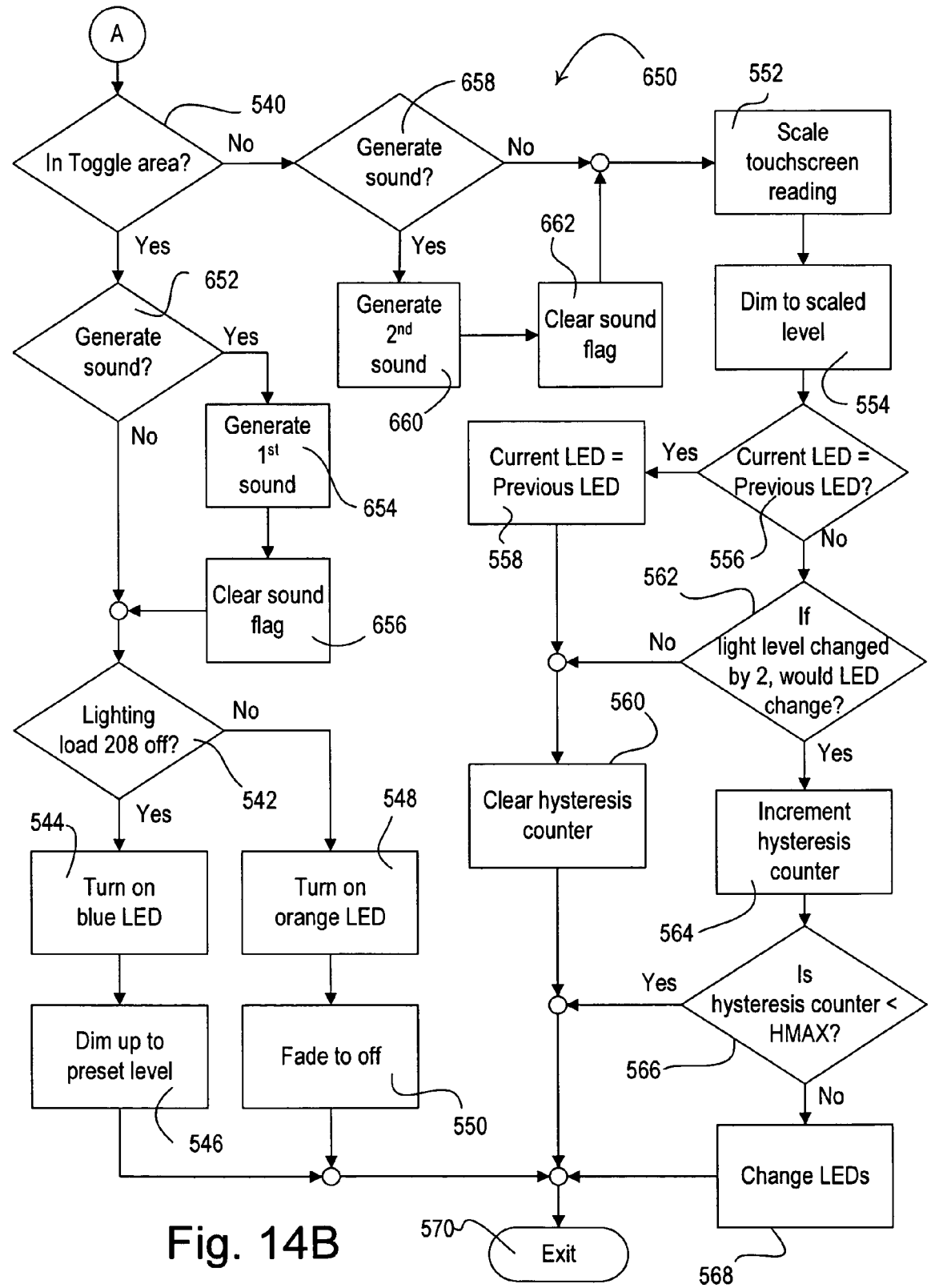

FIGS. 14A and 14B are flowcharts of an ActiveHold procedure 650 for generating a first sound and a second sound in response to a toggle event and a change intensity event, respectively. Referring to FIG. 14B, if the actuation of the touch sensitive member 110 is in the toggle area at step 540, the controller 214 determines at step 652 if the sound should be generated. Specifically, if the sound flag is set and if the sound counter has reached a maximum sound counter value $S_{MAX}$, the controller 214 drives the SOUND ENABLE signal 246 high and provides a first sound wave to the audible sound generator 224 to generate a first sound at step 654. Further, the sound flag is cleared at step 656 and the process continues on to toggle the lighting load 208. If the actuation is not a toggle event at step 540 and if the sound should be generated at step 658, the controller 214 drives the SOUND ENABLE signal 246 high and provides a second sound wave to the audible sound generator 224 to generate a second sound at step 660. At step 662, the sound flag is cleared ant the process continues on to adjust the intensity of the lighting load 208.

Figure 14C:
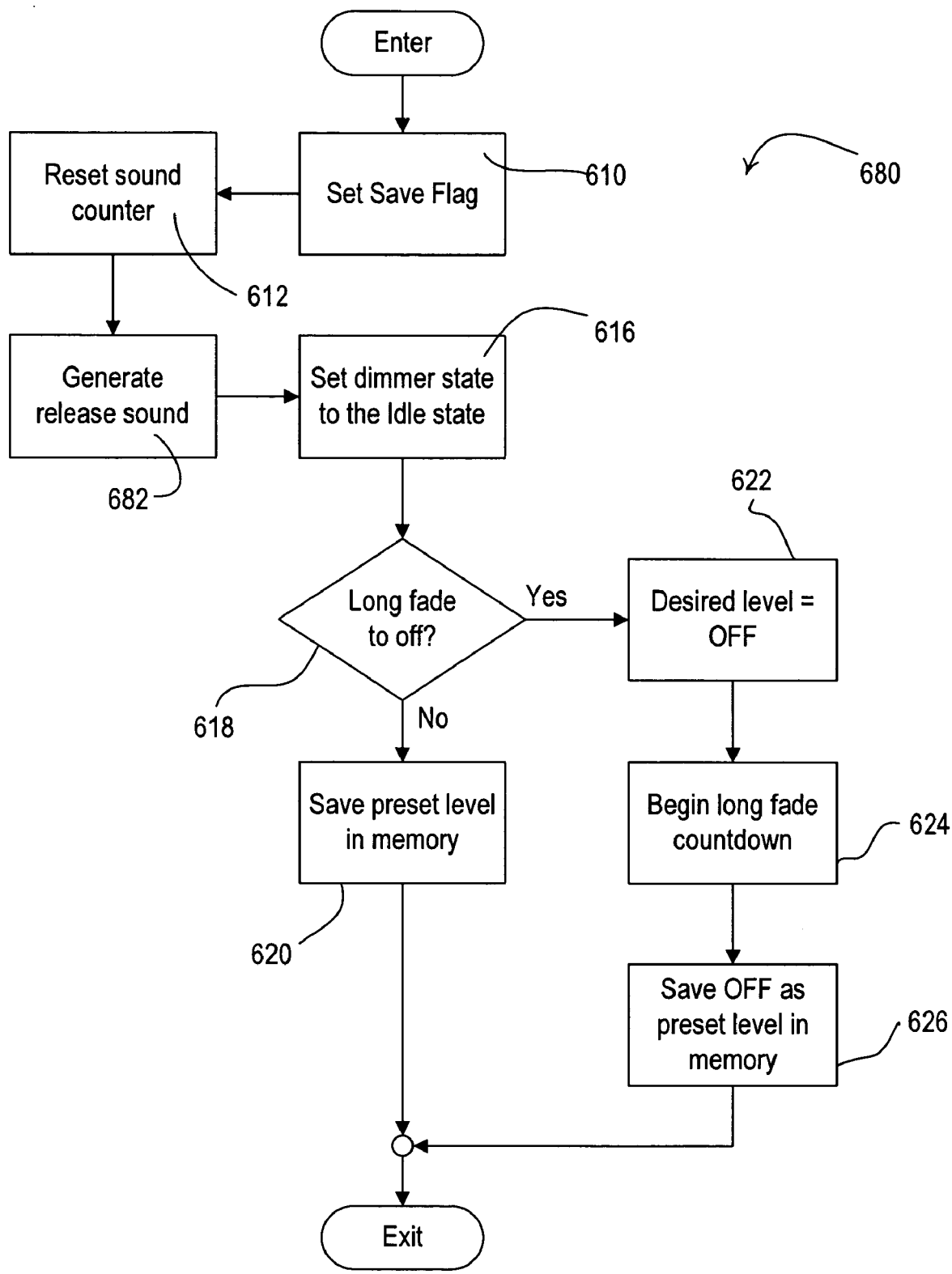
FIG. 14C is a flowchart of a Release procedure that includes an additional step for causing the audible sound generator to create a release sound.

Further, the controller 214 may be operable to cause the audible sound generator 224 to generate the audible sound in response to both a press and a release of the touch sensitive device 110 to mimic the sound that is created when a tactile switch, e.g., the switch controlled by the control switch actuator 18 of the prior art dimmer switch 10, is pressed. FIG. 14C is a flowchart of a Release procedure 680, which includes an additional step 682 for causing the audible sound generator to create a release sound. Preferably, the release sound is a different sound than was created at step 535 of the ActiveHold procedure 500.

Figure 15A:
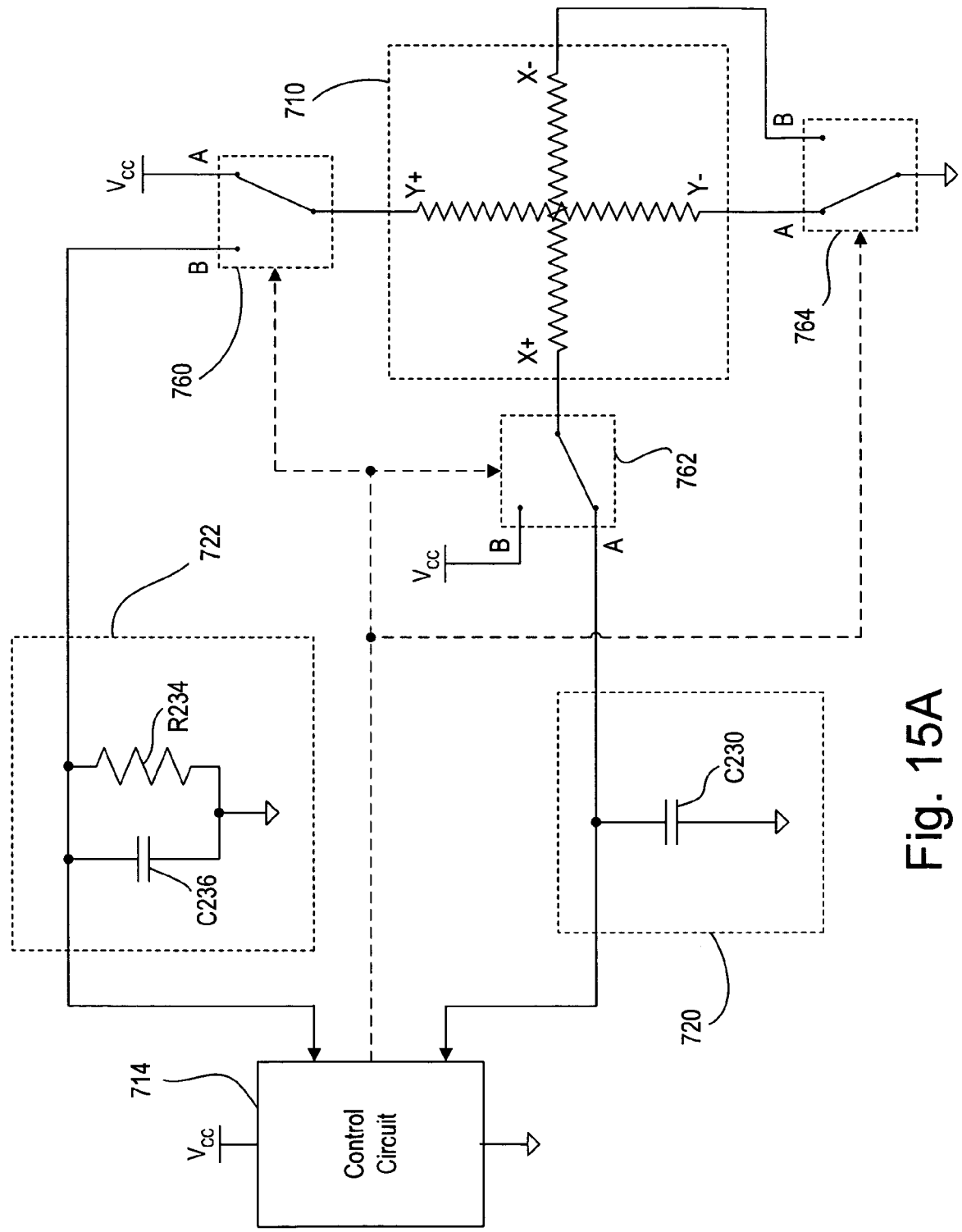
FIGS. 15A and 15B are simplified schematic diagrams of the circuitry for a four wire touch sensitive device and a controller of the touch dimmer of FIG. 4A according to a second embodiment of the present invention.
Figure 15B:
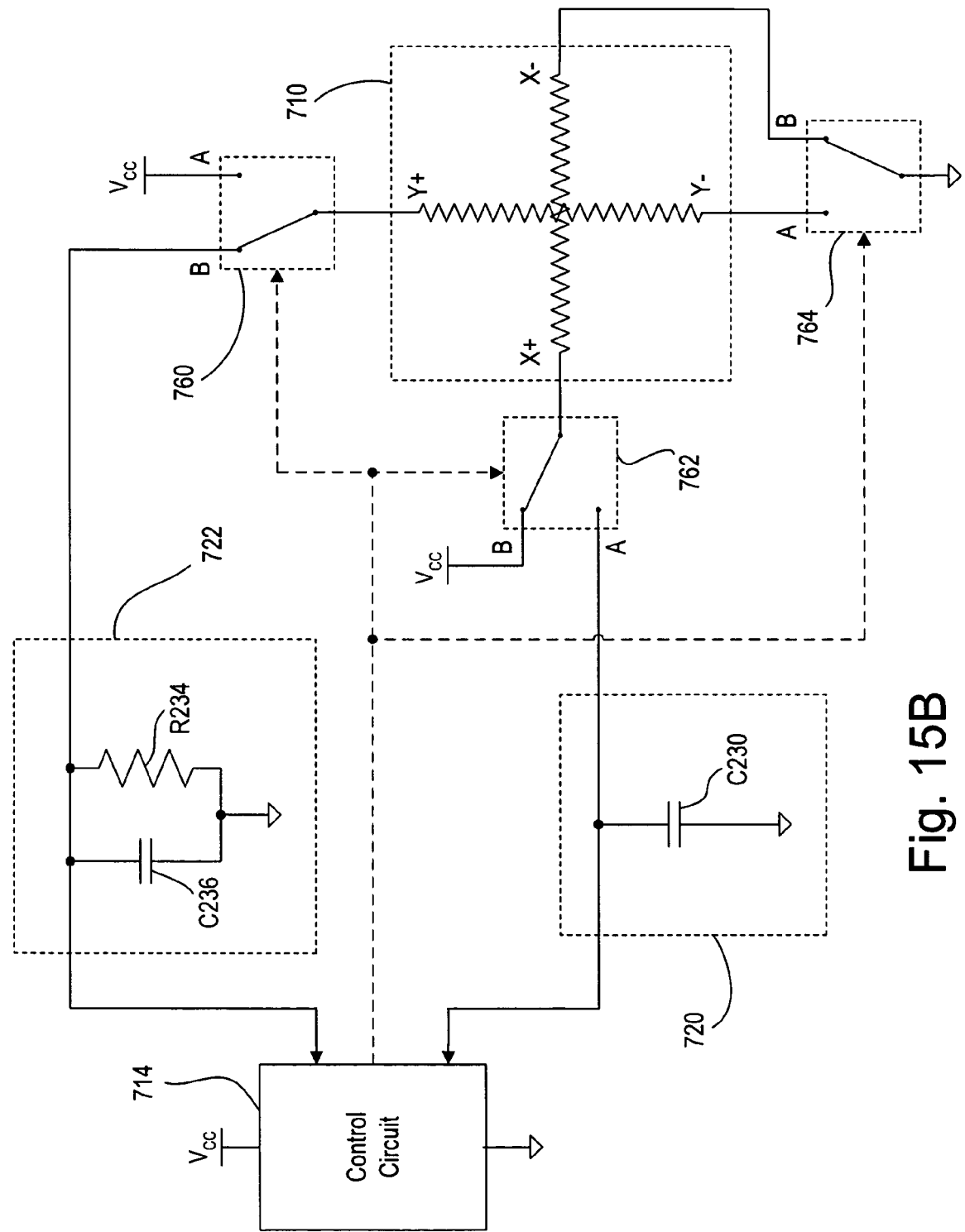

FIG. 15A and FIG. 15B are simplified schematic diagrams of the circuitry for a four-wire touch sensitive device 710 and a controller 714 according to a second embodiment of the present invention. The four-wire touch sensitive device 710 has four connections, i.e., electrodes, and provides two outputs: a first output representative of the position of a point actuation along the Y-axis, i.e., the longitudinal axis of the dimmer 100 a shown in FIG. 4B, and a second output representative of the position of the point actuation along the X-axis, i.e., an axis perpendicular to the longitudinal axis. The four-wire touch sensitive device 710 provides the outputs depending on how the DC voltage $V_{CC}$ is connected to the touch sensitive device. A stabilizing circuit 720 is operatively coupled to the first output and a usage detection circuit 722 is operatively coupled to the second output.

The controller 714 controls three switches 760, 762, 764 to connect the touch sensitive device 710 to the DC voltage $V_{CC}$ accordingly. When the switches 760, 762, 764 are connected in position A as shown in FIG. 15A, the DC voltage $V_{CC}$ is coupled across the Y-axis resistor, and the X-axis resistor provides the output to the stabilizing circuit 720. When the switches 760, 762, 764 are connected in position B as shown in FIG. 15B, the DC voltage $V_{CC}$ is coupled across the X-axis resistor, and the Y-axis resistor provides the output to the usage detection circuit 722. Since the controller 714 provides one output signal to control whether the stabilizing circuit 720 or the usage detection circuit 722 is coupled to the touch sensitive device 110, the software executed by the controller 714 is the same as the software executed by the controller 214 shown in FIGS. 10-13.

Figure 15C:
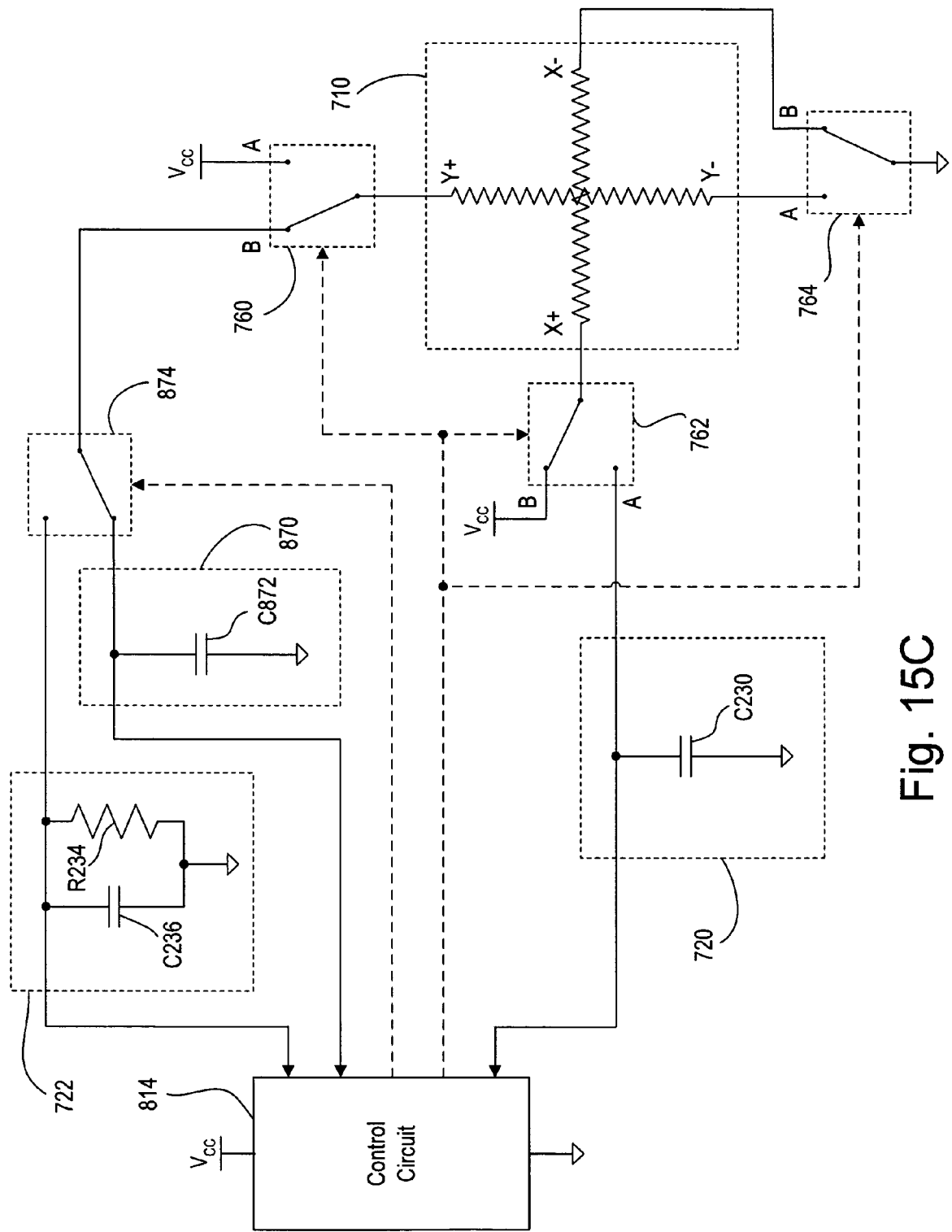
FIG. 15C is a simplified schematic diagram of the circuitry for a four wire touch sensitive device and a controller of the touch dimmer of FIG. 4A according to a third embodiment of the present invention.

FIG. 15C is a simplified schematic diagram of the circuitry for the four-wire touch sensitive device 710 and a controller 814 according to a third embodiment of the present invention. The controller 814 is operable to read the position of a point actuation on the four-wire touch sensitive device 710 along both the Y-axis and the X-axis. When determining the position along the Y-axis, the controller 814 operates the same as the controller 714 shown in FIGS. 15A and 15B by controlling the switches 760, 762, 764 as described above.

An additional stabilizing circuit 870 is provided for determining the position of the point actuation along the X-axis. The additional stabilizing circuit 870 comprises a whacking-grade capacitor C872. The controller 814 controls a switch 874 to selectively switch the output of the X-axis between the usage detection circuit 722 and the additional stabilizing circuit 870. The controller 814 controls the switch 874 in a similar fashion to how the controller 214 controls the switches 232, 238 (as shown in FIG. 8).

Figure 16A:
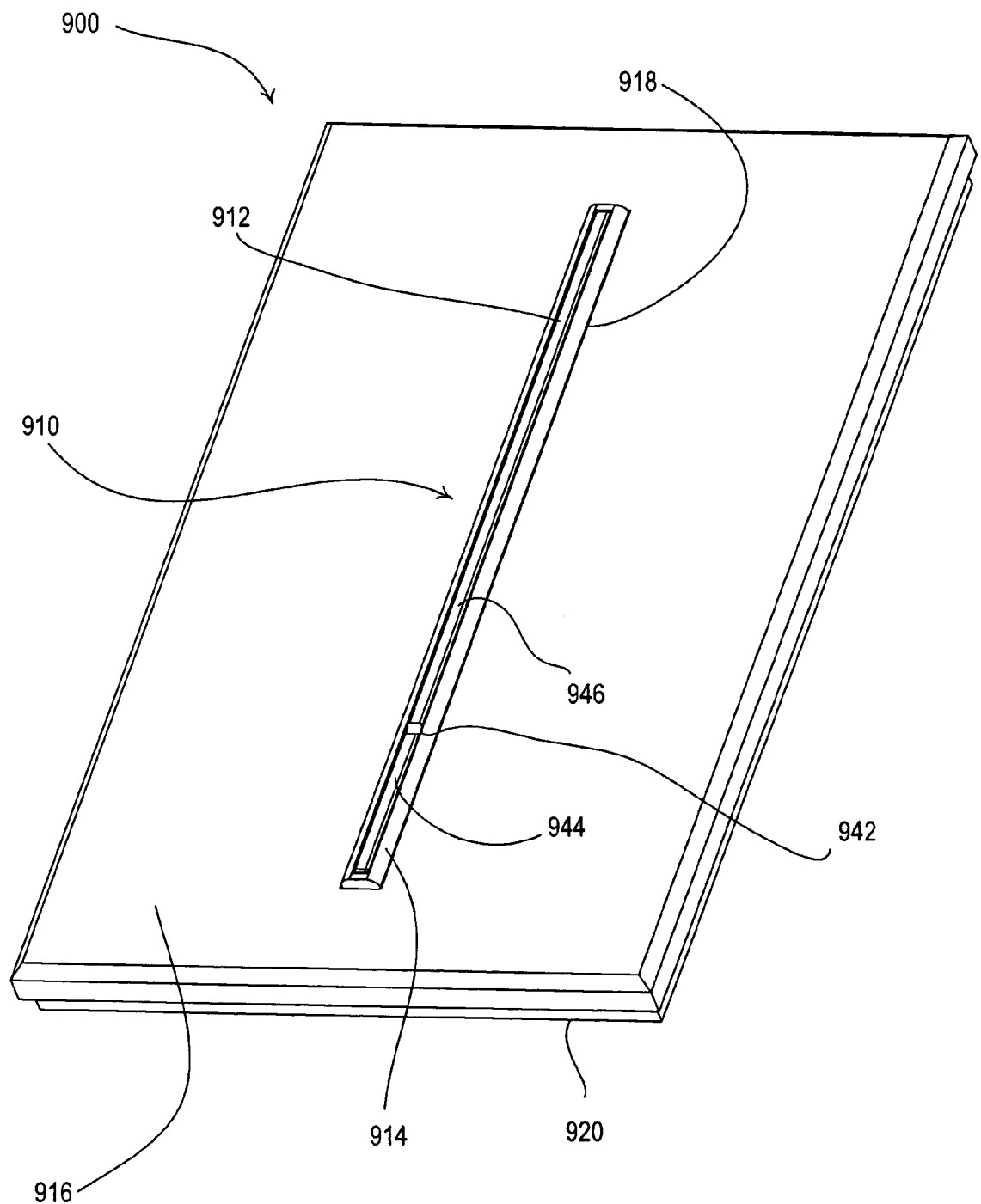
FIG. 16A is a perspective view of a touch dimmer according to a fourth embodiment of the present invention.
Figure 16B:
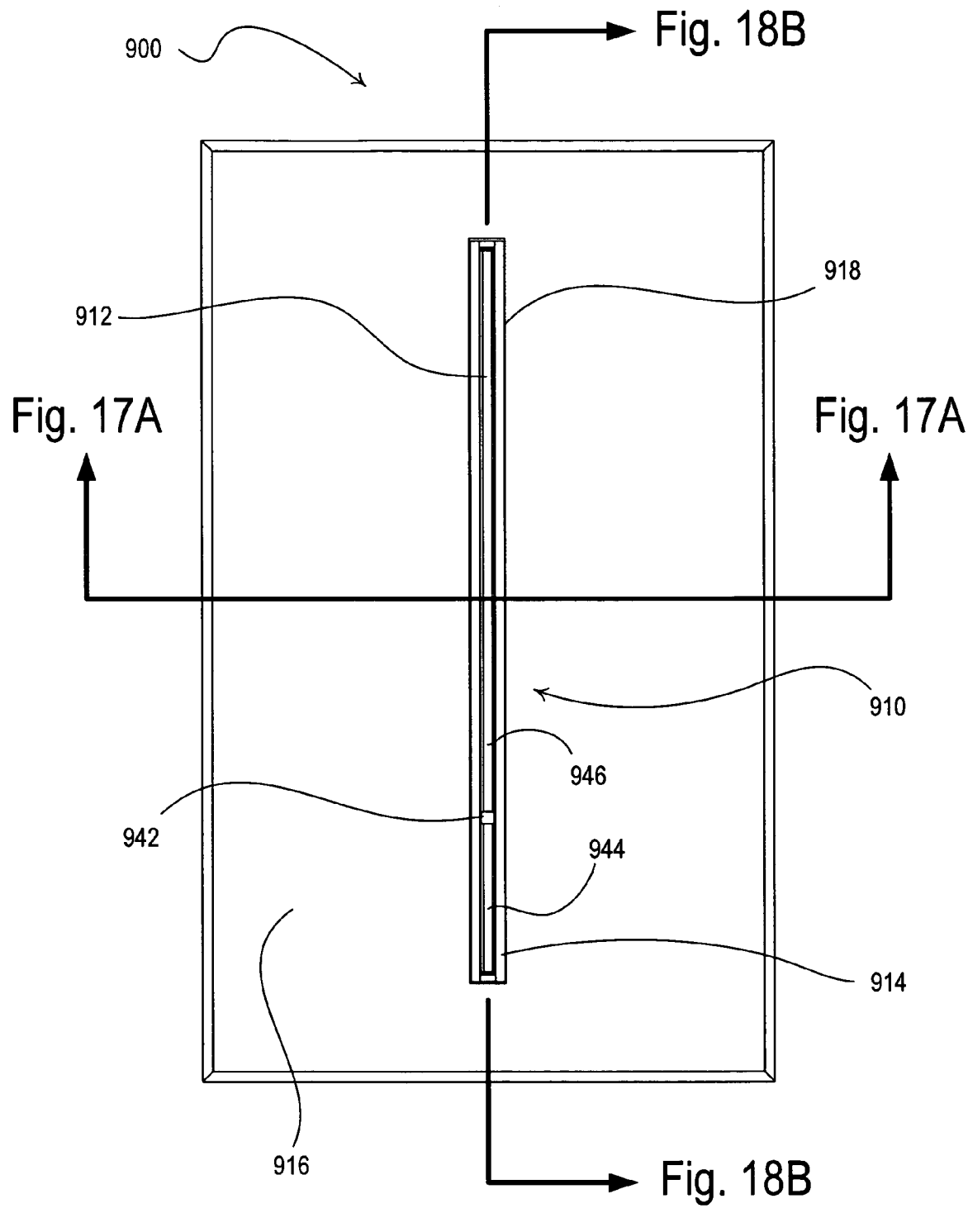
FIG. 16B is a front view of the touch dimmer of FIG. 16A.
Figure 17A:
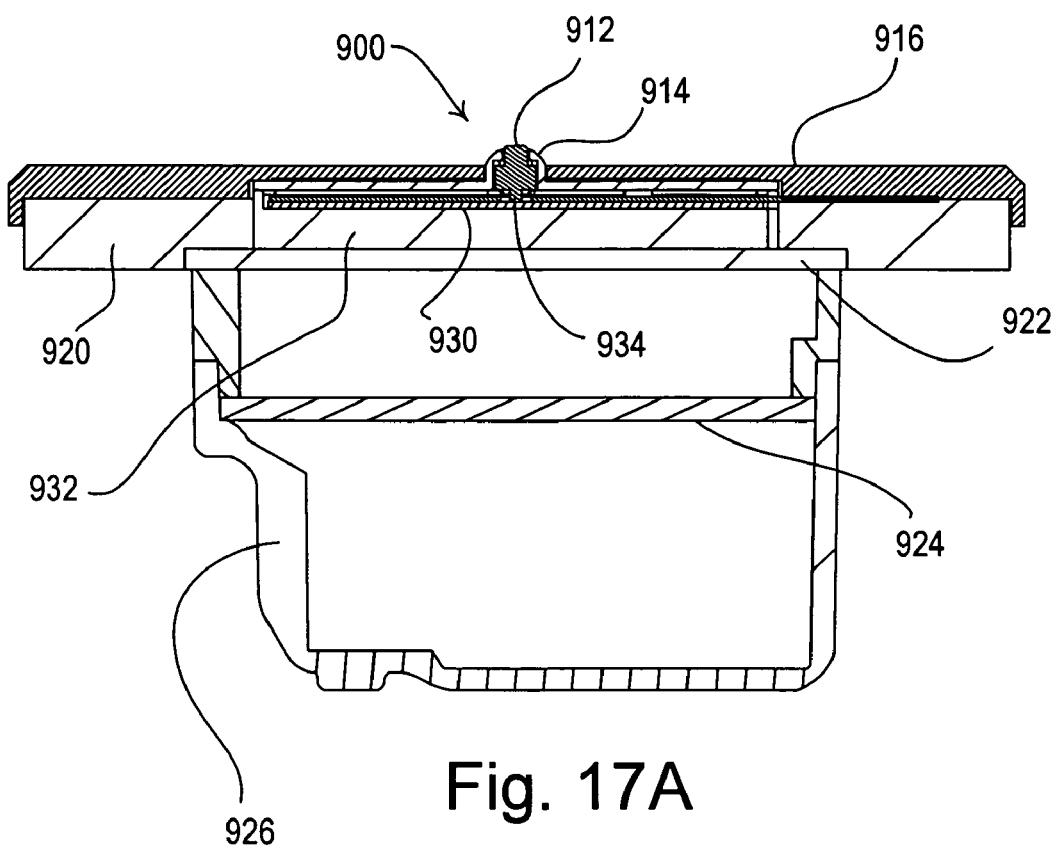
FIG. 17A is a bottom cross-sectional view of the touch dimmer of FIG. 16B.
Figure 17B:
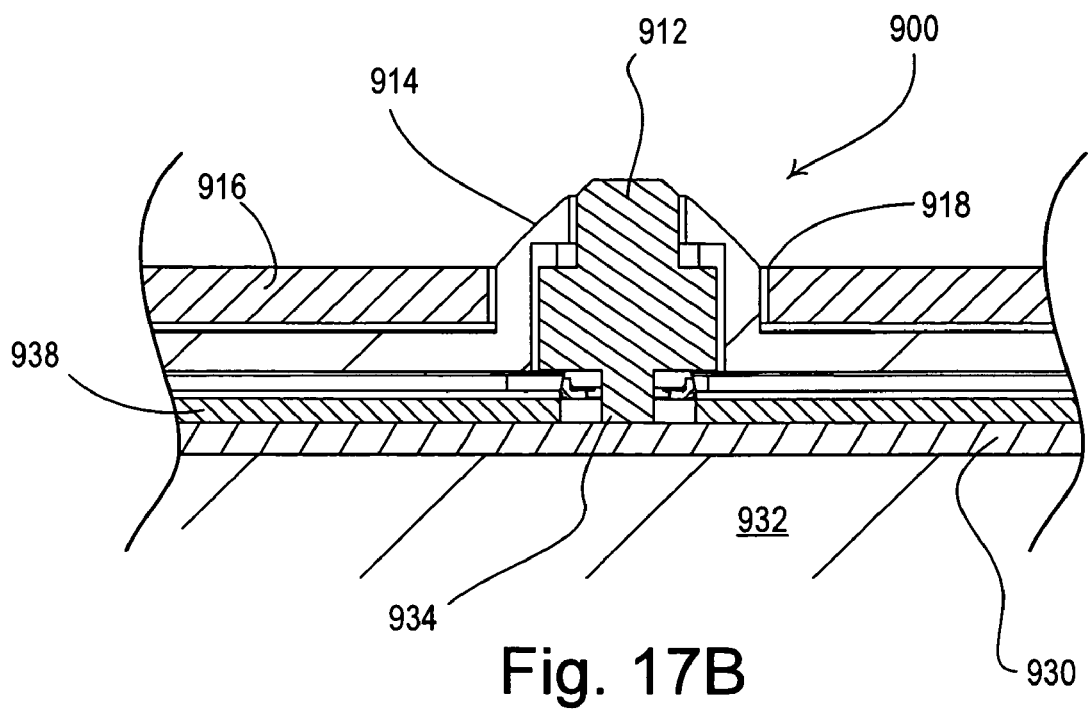
FIG. 17B is an enlarged partial view of the bottom cross-sectional view of FIG. 17A.
Figure 18A:
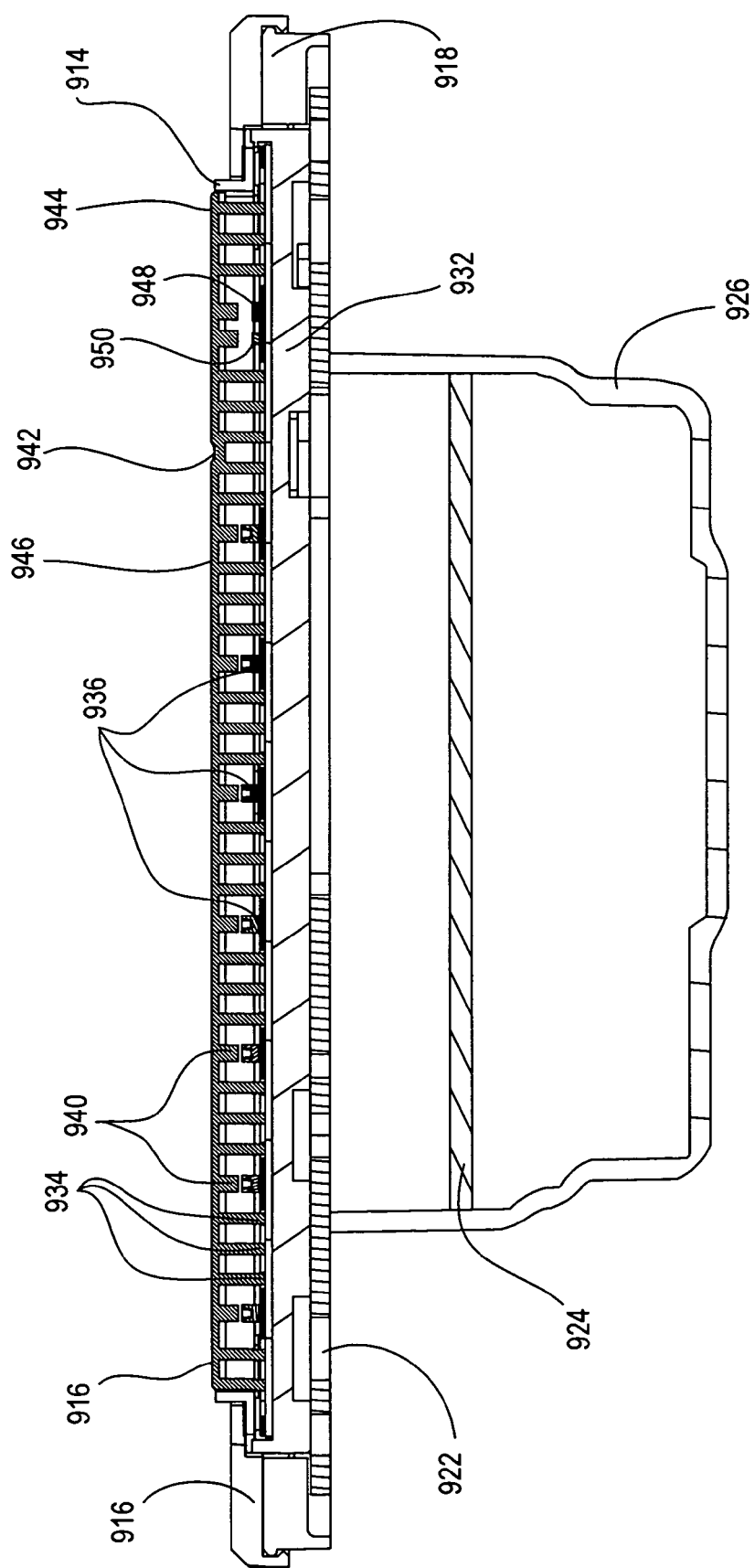
FIG. 18A is a left side cross-sectional view of the touch dimmer of FIG. 16B.
Figure 18B:
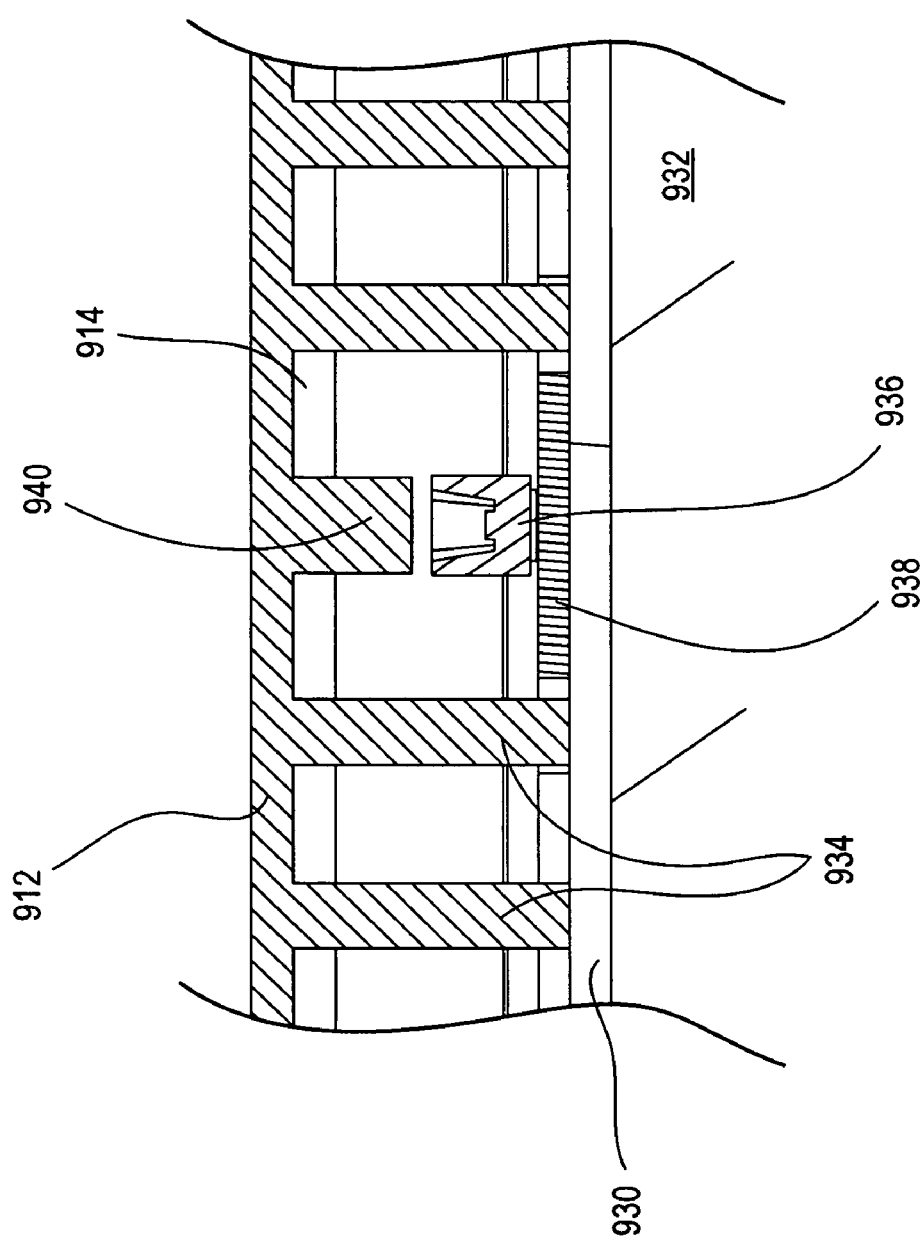
FIG. 18B is an enlarged partial view of the left side cross-sectional view FIG. 18A.

FIGS. 16A and 16B are a perspective view and a front view, respectively, of a touch dimmer 900 according to a fourth embodiment of the present invention. FIG. 17A is a bottom cross-sectional view and FIG. 17B is an enlarged partial bottom cross-sectional view of the dimmer 900. FIG. 18A is a left side cross-sectional view and FIG. 18B is an enlarged partial left side cross-sectional view of the dimmer 900.

The touch dimmer 900 includes a thin touch sensitive actuator 910 comprising an actuation member 912 extending through a bezel 914. The dimmer 900 further comprises a faceplate 916, which has a non-standard opening 918 and mounts to an adapter 920. The bezel 914 is housed behind the faceplate 916 and extends through the opening 918. The adapter 920 connects to a yoke 922, which is adapted to mount the dimmer 900 to a standard electrical wallbox. A main printed circuit board (PCB) 924 is mounted inside an enclosure 926 and includes the some of the electrical circuitry of the dimmer 200, e.g., the semiconductor switch 210, the gate drive circuit 212, the controller 214, the zero-crossing detect circuit 216, the power supply 218, the stabilizing circuit 220, the usage detection circuit 222, the audible sound generator 224, and the memory 225, of the dimmer 200. The thin touch sensitive actuator 910 preferably extends beyond the faceplate by 1/16", i.e., has a height of 1/16", but may have a height in the range of 1/32" to 3/32". Preferably, the touch sensitive actuator 910 has a length of 3 5/8" and a width of 3/16". However, the length and the width of the touch sensitive actuator 910 may be in the ranges of 2 5/8"-4" and 1/8"-1/4", respectively.

The touch sensitive actuator 910 operates to contact a touch sensitive device 930 inside the touch dimmer 900. The touch sensitive device 930 is contained by a base 932. The actuation member 912 includes a plurality of long posts 934, which contact the front surface of the touch sensitive device 930 and are arranged in a linear array along the length of the actuation member. The posts 934 act as force concentrators to concentrate the force from an actuation of the actuation member 912 to the touch sensitive device 930.

Figure 19:
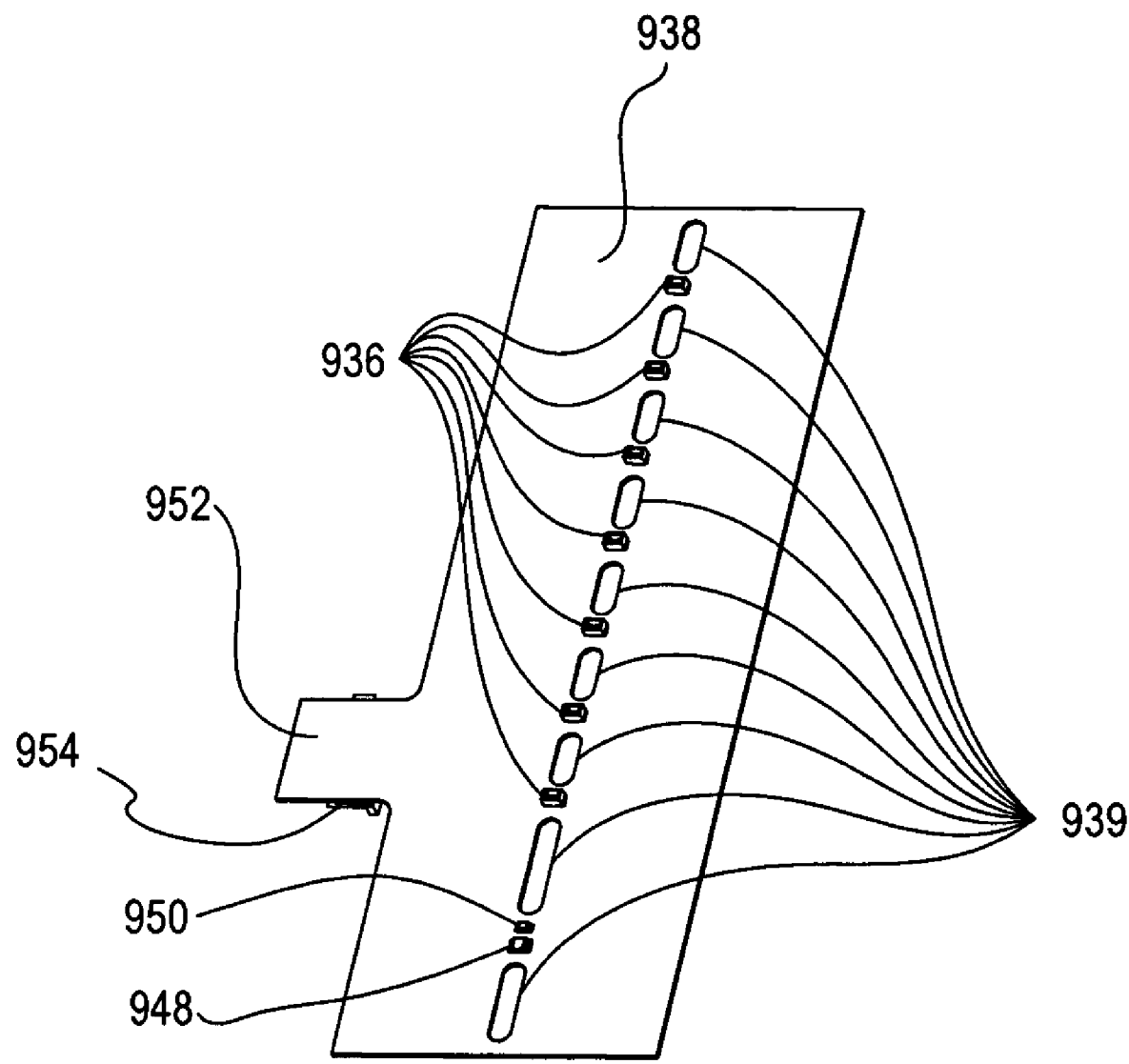
FIG. 19 is a perspective view of a display printed circuit board of the dimmer of FIG. 16A.

A plurality of status indicators 936 are arranged in a linear array behind the actuation member 912. The status indicators are mounted on a display PCB 938, i.e., a status indicator support board, which is mounted between the touch sensitive device 930 and the bezel 914. FIG. 19 is a perspective view of the display PCB 938. The display PCB 938 includes a plurality of holes 939, which the long posts 934 extend through to contact the touch sensitive device 930. The actuation member 912 is preferably constructed from a translucent material such that the light of the status indicators 936 is transmitted to the surface of the actuation member. A plurality of short posts 940 are provided in the actuation member 912 directly above the status indicators 936 to operate as light pipes for the linear array of status indicators. The display PCB 938 comprises a tab 952 having a connector 954 on the bottom side for connecting the display PCB 938 to the main PCB 924.

The actuation member 912 comprises a notch 942, which separates a lower portion 944 and an upper portion 946 of the actuation member. Upon actuation of the lower portion 944 of the actuation member 912, the dimmer 900 causes the connected lighting load to toggle from on to off (and vice versa). Preferably, a blue status indicator 948 and an orange status indicator 950 are located behind the lower portion 944, such that the lower portion is illuminated with blue light when the lighting load is on and illuminated with orange light with the lighting load is off. Actuation of the upper portion 946 of the actuation member 912, i.e., above the notch 942, causes the intensity of the lighting load to change to a level responsive to the position of the actuation on the actuation member 912. The status indicators 936 behind the status markers 112 are illuminated to display the intensity of the lighting load as with the previously-discussed touch dimmer 100.

Figure 20:
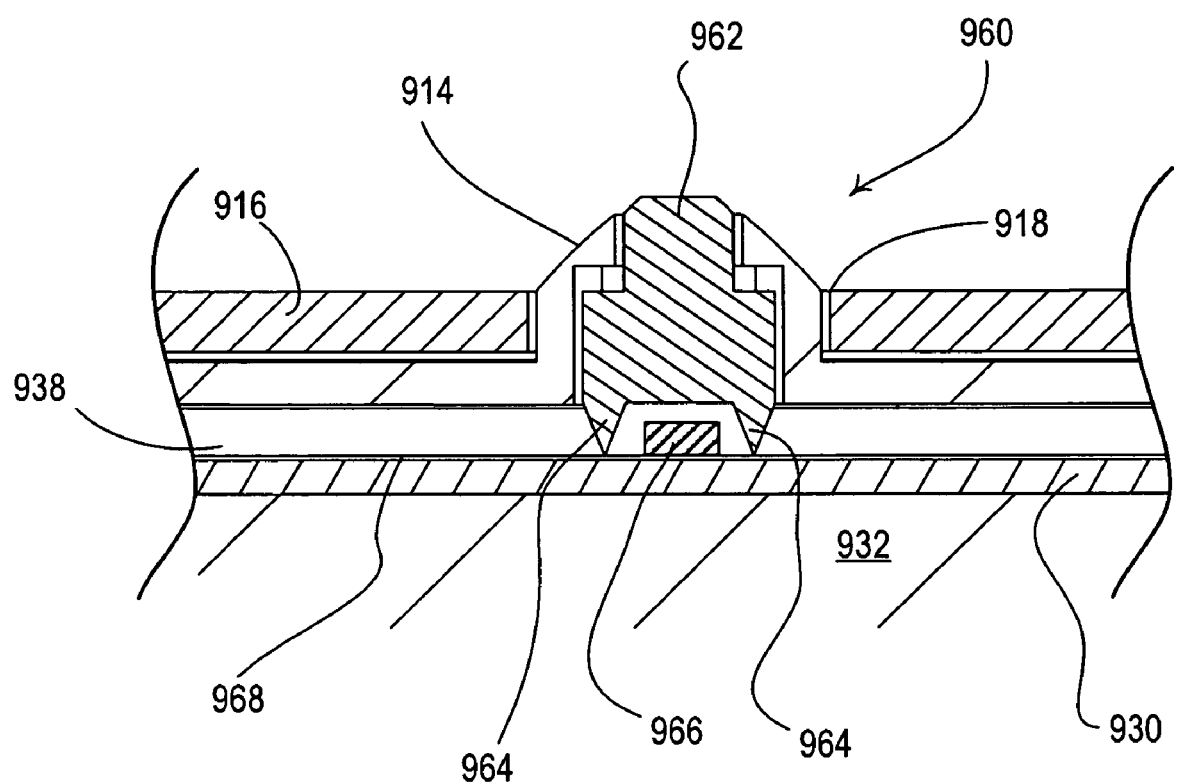
FIG. 20 is an enlarged partial bottom cross-sectional view of a thin touch sensitive actuator according to a fifth embodiment of the present invention.

FIG. 20 is an enlarged partial bottom cross-sectional view of a thin touch sensitive actuator 960 according to a fifth embodiment of the present invention. The touch sensitive actuator 960 comprises an actuation member 962 having two posts 964 for actuating the touch sensitive device 930. A plurality of status indicators 966 are mounted on a flexible display PCB 968, i.e., a flexible status indicator support board, which the posts 964 of the actuation member 962 are operable to actuate the touch sensitive device 930 through. The status indicators 966 are preferably blue LEDs and are arranged along the length of the actuation member 962. Preferably, the actuation member 962 is constructed from a translucent material such that the light of the status indicators 966 is transmitted to the surface of the actuation member.

Figure 21B:
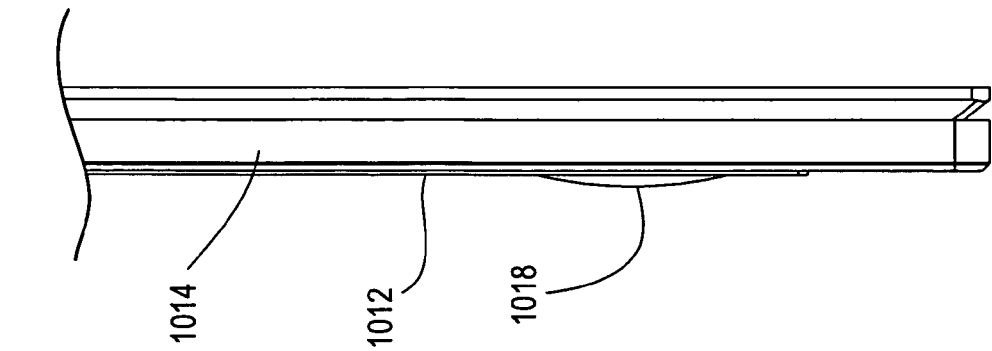
FIG. 21B is an enlarged right side view of the touch dimmer of FIG. 21A.
Figure 21A:
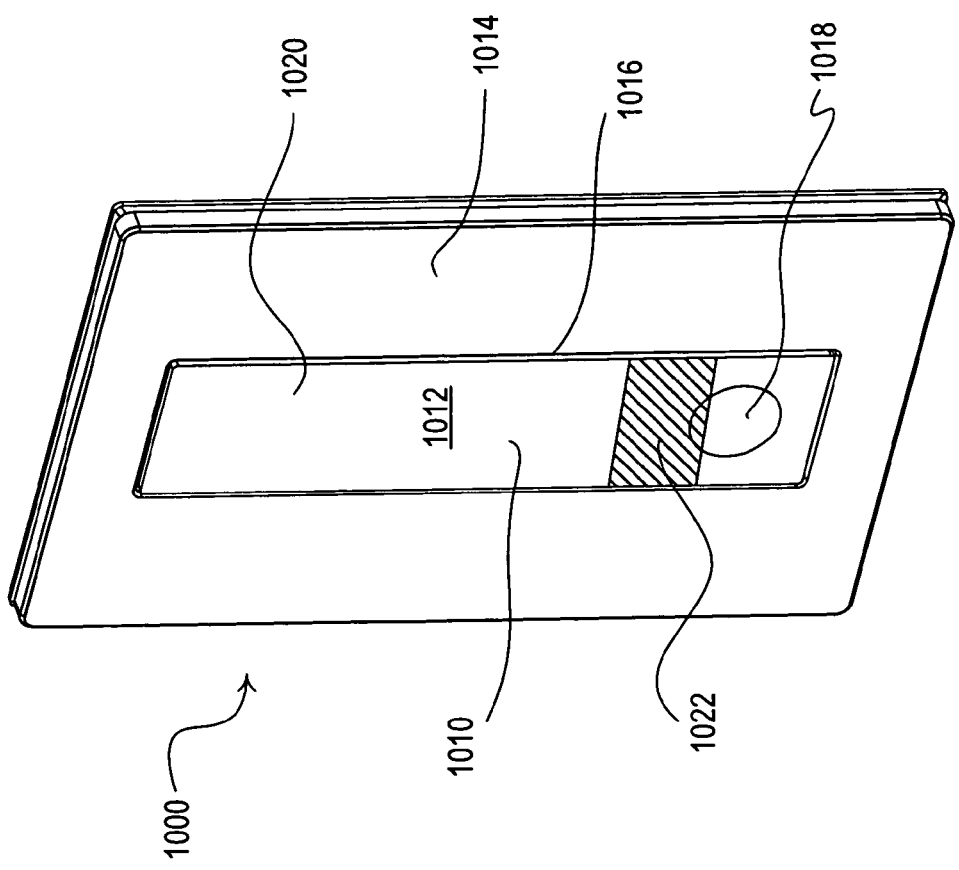
FIG. 21A is a perspecitive view of a touch dimmer according to a sixth embodiment of the present invention.

FIG. 21A is a perspective view and FIG. 21B is an enlarged side view of a touch dimmer 1000 according to a sixth embodiment of the present invention. The dimmer 1000 comprises a bezel 1010 having a front surface 1012 and a faceplate 1014 having an opening 1016. Actuation of the front surface 1012 actuates a touch sensitive device (not shown) inside the dimmer (in a similar fashion as the dimmer 100). The dimmer 1000 further comprises a shallow domed protrusion 1018, i.e., a raised area, on the front surface 1012 of the bezel 1010. Actuation of the shallow domed protrusion 1018 causes the dimmer 1000 to toggle a connected lighting load (not shown) from off to on (and vice versa). Actuation of an upper portion 1020 of the front surface 1012 of the bezel 1010 above the dome protrusion 1018 causes the dimmer 1000 to change the intensity of the lighting load. The dimmer 1000 further comprises a status indicator, e.g., an LED, immediately behind the shallow domed protrusion 1018 to illuminate the protrusion.

Preferably, a keepout region 1022 is provided between the dome protrusion 1018 and the upper portion 1020 of the front surface 1012 of the bezel 1010. The dimmer 1000 does not respond to actuations of the keepout region 1022. Accordingly, a portion of the touch sensitive device immediately below the domed protrusion 1018, i.e., the "toggle actuator", and the upper portion 1020 is disabled to provide the keepout region 1022.

Figure 22:
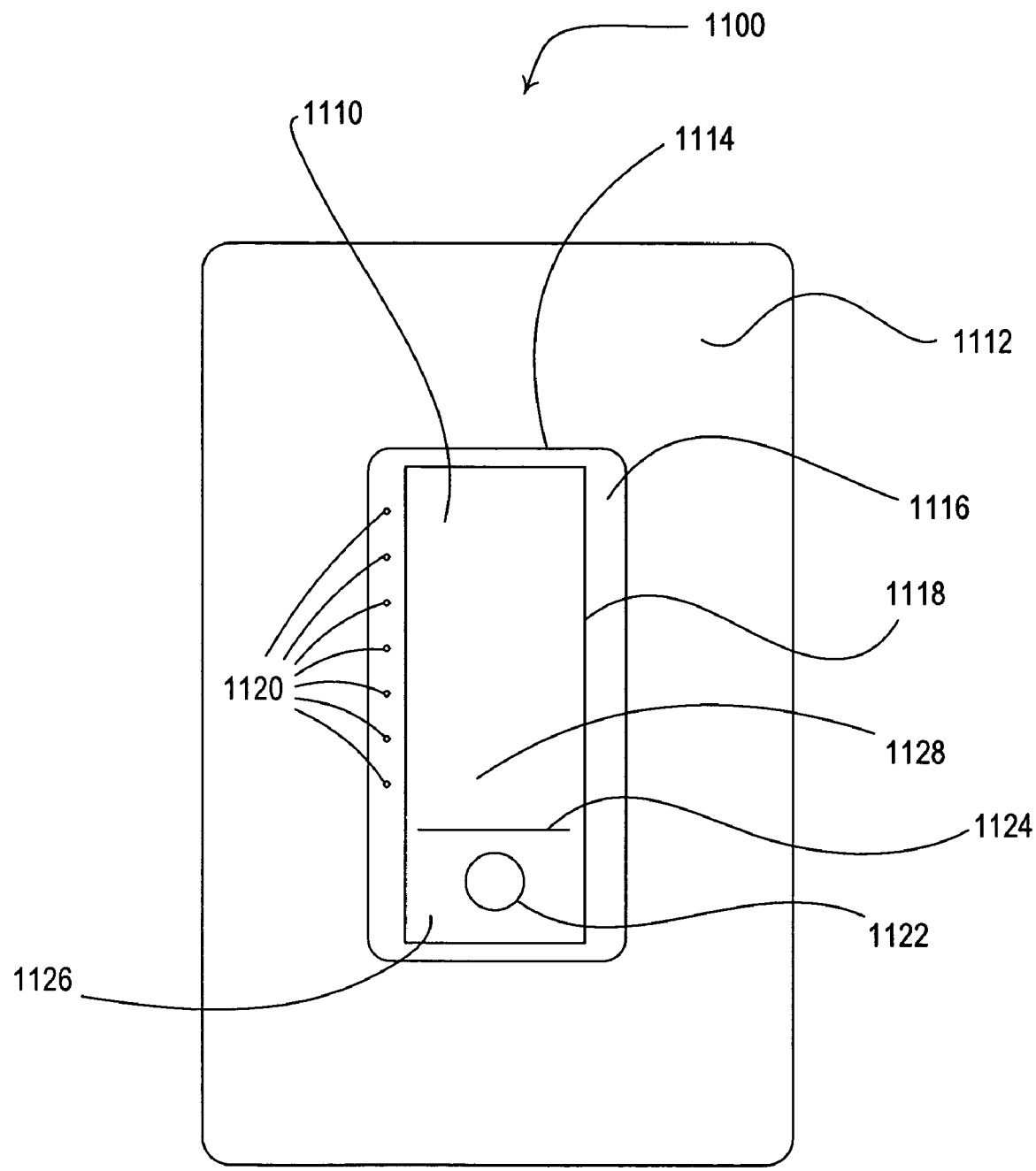
FIG. 22 is a front view of a touch dimmer according to a seventh embodiment of the present invention.

FIG. 22 is a front view of a touch dimmer 1100 according to a seventh embodiment of the present invention. The dimmer 1100 comprises a touch sensitive device 1110 and a faceplate 1112 having a designer-style opening 1114. The touch sensitive device 1110 is surrounded by a bezel 1116, i.e., a thin escutcheon frame, such that the touch sensitive device 1110 is provided in a rectangular opening 1118 of the bezel. A plurality of status indicators 1120 are arranged in a linear array on one side of the bezel 1116.

The touch sensitive device 1110 has a marker dot 1122 and a separator line 1124 printed on its front surface. The separator line 1124 is located between a lower portion 1126 and an upper portion 1128 of the touch sensitive device 1110. Actuation of the lower portion 1126 surrounding the marker dot 1122 will toggle a connected lighting load on and off. Actuation of the upper portion 1128 of the touch sensitive device Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A load control device for controlling the amount of power delivered to an electrical load from an AC power source, the load control device comprising:
    a semiconductor switch operable to be coupled in series electrical connection between the source and the load, the semiconductor switch having a control input for controlling the semiconductor switch between a non-conductive state and a conductive state;
    a controller operatively coupled to the control input of the semiconductor switch for controlling the semiconductor switch between the non-conductive state and the conductive state;
    a touch screen actuator having a touch sensitive front surface responsive to a plurality of point actuations, each characterized by a position and a force, the touch screen actuator having an output operatively coupled to the controller for providing a control signal representative of the position of the point actuation;
    a visual display responsive to the controller; and
    an audible sound generator responsive to the controller;
    wherein the controller is operable to cause the visual display to illuminate and the audible sound generator to generate an audible sound in response to the control signal of the touch screen actuator.

2. A user interface for a lighting control, the user interface comprising:
    a touch screen actuator having a touch sensitive front surface responsive to a plurality of point actuations, each characterized by a position and a force, the touch screen actuator having an output for providing a control signal representative of the position of the point actuation;
    a visual display operable to illuminate in response to the control signal of the touch screen actuator; and
    an audible sound generator operable to generate an audible sound in response to the control signal of the touch screen actuator.

3. A load control device for controlling the amount of power delivered to an electrical load from an AC power source, the load control device comprising:
    a semiconductor switch operable to be coupled in series electrical connection between the source and the load, the semiconductor switch having a control input for controlling the semiconductor switch between a non-conductive state and a conductive state;
    a controller operatively coupled to the control input of the semiconductor switch for controlling the semiconductor switch between the non-conductive state and the conductive state;
    a touch screen actuator having a touch sensitive front surface responsive to a plurality of point actuations, each characterized by a position and a force, the touch screen actuator having an output operatively coupled to the controller for providing a first control signal in response to a first point actuation and a second control signal in response to a second point actuation; and
    an audible sound generator responsive to the controller;
    wherein the controller is operable to cause the audible sound generator to generate a first audible sound in response to the first control signal and a second audible sound in response to the second control signal.

4. A user interface for a lighting control, the user interface comprising:
    a touch screen actuator having a touch sensitive front surface responsive to a plurality of point actuations, each characterized by a position and a force, the touch screen actuator having an output for providing a first control signal in response to a first point actuation and a second control signal in response to a second point actuation; and
    an audible sound generator operable to generate a first audible sound in response to the first control signal and a second audible sound in response to the second control signal.

5. A load control device for controlling the amount of power delivered to an electrical load from an AC power source, the load control device comprising:
    a semiconductor switch operable to be coupled in series electrical connection between the source and the load, the semiconductor switch having a control input for controlling the semiconductor switch between a non-conductive state and a conductive state;

a controller operatively coupled to the control input of the semiconductor switch for controlling the semiconductor switch between the non-conductive state and the conductive state;

a touch screen actuator having a touch sensitive front surface responsive to a plurality of point actuations, each characterized by a position and a force, the touch screen actuator operable to begin providing a control signal to the controller when the magnitude of the force of each of the point actuations exceeds substantially a minimum magnitude and to cease providing the control signal when the magnitude of the force subsequently decreases below substantially the minimum magnitude of the point actuation; and an audible sound generator responsive to the controller;

wherein the controller is operable to cause the audible sound generator to generate a first audible sound in response to the control signal when the magnitude of the force of each of the point actuations exceeds substantially the minimum magnitude, and to generate a second audible sound in response to the control signal when the magnitude of the force subsequently decreases below substantially the minimum magnitude of the point actuation.

6. A user interface for a lighting control, the user interface comprising:

a touch screen actuator having a touch sensitive front surface responsive to a plurality of point actuations, each characterized by a position and a force, the touch screen actuator operable to begin providing a control signal when the magnitude of the force of each of the point actuations exceeds substantially a minimum magnitude and to cease providing the control signal when the magnitude of the force subsequently decreases below substantially the minimum magnitude of the point actuation; and an audible sound generator operable to generate a first audible sound in response to the control signal when the magnitude of the force of each of the point actuations exceeds substantially the minimum magnitude, and to generate a second audible sound in response to the control signal when the magnitude of the force subsequently decreases below substantially the minimum magnitude of the point actuation.

7. A control structure for an electrical control system for producing a variable output electrical signal to an electrical load for controllably varying the output of said load, said control structure comprising:

(a) an enclosed volume which contains control electronics;

(b) a cover plate on one surface of said enclosed volume having a planar front surface and having a rectangular opening therein;

(c) a transparent touch pad disposed in said rectangular opening and coupled to said control electronics and adapted to produce an output signal which is related to the position within the area of said touch pad at which said touch pad is touched by an operator;

(d) a plurality of vertically arranged markers printed on said touch pad to serve as scale indicator;

(e) a plurality of status indicators coupled to said control electronics for illuminating respective discrete locations on said touch pad which lie on a line along the length of said touch pad and in a predetermined alignment with respective ones of said printed markers and being respectively illuminated adjacent the position on said touch pad at which said touch pad is touched by an operator;

(f) a small marker at the bottom of said touch pad and in the center of the width of said touch pad, wherein said control electronics are operable to toggle said load when said touch pad is touched at the location of said small marker; and (g) at least a first status indicator connected to said control electronics and positioned to illuminate said marker and when said touch pad is touched at said small diameter marker dot to turn off said load.

8. The control structure of claim 7, wherein said load is at least one dimmable light source.

9. The control structure of claim 7, wherein said control structure is a wall box structure adapted for mounting on a wall.

10. The control structure of claim 7, wherein said touch pad is substantially coplanar with said planar front surface.

11. The control structure of claim 7, wherein said touch pad is disposed in a plane parallel to and above the plane of said planar front surface.

12. The control structure of claim 7, wherein said rectangular opening has a height of about 4 to about 6 times its width.

13. The control structure of claim 7, wherein said rectangular openings has a height of about 5 times its width.

14. The control structure of claim 7, wherein said rectangular opening is a designer-style opening having a height which is about twice its width.

15. The control structure of claim 7, wherein said rectangular opening fills substantially the full area of said cover plate and is surrounded by a thin outer rim of said cover plate.

16. The control structure of claim 7, wherein said plurality of LEDs consist of at least 7 blue LEDs.

17. The control structure of claim 7, wherein said discrete locations illuminated by said plurality of LEDs are disposed along one vertical edge of said touch pad.

18. The control structure of claim 7, wherein the plurality of status indicators comprise a plurality of LEDs.

19. The control structure of claim 18, wherein said discrete locations are vertically disposed along the center of the width of said touch pad, and wherein said LEDs are blue LEDs.

20. The control structure of claim 7, further comprising:

a second status indicator of color different from that of said first status indicator, the second status indicator coupled to said control electronics and operable to illuminate said small marker when said touch screen is touched at any location.

21. The control structure of claim 18, wherein said LEDs extend through said touch screen at said discrete locations.

22. The control structure of claim 18, wherein said LEDs are disposed beneath and are spaced from the bottom of said touch screen and further including light conductors extending from each of said LEDs to respective ones of said discrete locations behind said touch screen.

23. The control structure of claim 7, further comprising:

an airgap switch in said enclosed volume; and an operator for the airgap switch, said operator including a lever having an end which extends only sufficiently through said cover plate at the bottom of said rectangular opening to be gripped by the fingernail of an operator.

24. The control structure of claim 7, further comprising:

a rectangular frame for supporting said touch pad at its outer periphery, said frame extending through said rectangular opening, said frame comprising a shallow cup having a flange at its open end, said flange being captured by a cooperating extension from the exterior of said rectangular opening, said touch pad width being greater than the width of said rectangular opening.

25. The control structure of claim 7, wherein said small marker comprises a small marker dot.

26. A control structure for an electrical control system for producing a variable output electrical signal to an electrical load for controllably varying the output of said load, said control structure comprising:
(a) an enclosed volume which contains control electronics;
(b) cover plate on one surface of said enclosed volume having a planar front surface and having a rectangular opening therein;
(c) a transparent touch pad disposed in said rectangular opening and coupled to said control electronics and adapted to produce an output signal which is related to the position within the area of said touch pad at which said touch pad is touched by an operator;
(d) a thin escutcheon frame surrounding said rectangular opening;
(e) a plurality of status indicators coupled to said control electronics and disposed along the length of one side of said escutcheon frame and adjacent said touch pad;
(f) a small marker at the bottom of said touch pad and in the center of the width of said touch pad, wherein the control electronics are operable to turn off said load when said touch pad is touched at the location of said small marker; and
(g) at least a first LED positioned to illuminate said small marker and connected to said control electronics when said touch pad is touched at said small marker to turn off said load.

27. The control structure of claim 26, wherein said load is at least one dimmable light source.

28. The control structure of claim 26, wherein said control structure is a wall box structure adapted for mounting on a wall.

29. The control structure of claim 26, wherein said touch pad is substantially coplanar with said planar front surface.

30. The control structure of claim 26, wherein said touch pad is disposed in a plane parallel to and beneath the plane of said planar front surface.

31. The control structure of claim 26, wherein said rectangular opening has a height of about 4 to about 6 times its width.

32. The control structure of claim 26, wherein the plurality of status indicators comprise a plurality of LEDs.

33. The structure of claim 32, wherein said plurality of LEDs consist of at least 7 blue LEDs.

34. The control structure of claim 26, wherein said small marker comprises a small marker dot.

35. The control structure of claim 26, further comprising:
an airgap switch in said enclosed volume; and
an operator for said airgap switch, said operator comprising a lever having an end which extends only sufficiently through said cover plate at the bottom of said rectangular opening to be gripped by the finger nail of an operator.

36. A control structure for an electrical control system for producing a variable output electrical signal to an electrical load for controllably varying an output of said load, said control structure comprising:
(a) an enclosed volume which contains control electronics;
(b) a cover plate on one surface of said enclosed volume having a planar front surface and having a rectangular opening therein;
(c) a touch pad disposed in said rectangular opening and coupled to said control electronics and adapted to produce an output signal which is related to the position within the area of said touch pad at which said touch pad is touched by an operator; and
(d) a manually sensible area at the bottom of said touch pad, wherein depression of said area operates an on/off operation of said control electronics.

37. The control structure of claim 36, wherein said manually sensible area is a shallow-raised area.

38. The control structure of claim 36, wherein said manually sensible area is a shallow domed protrusion.

39. The control structure of claim 36, wherein said rectangular opening has a height of about 4 to about 6 times its height.

40. The control structure of claim 36, further comprising:
a first status indicator positioned to illuminate said manually sensible area.

41. The control structure of claim 40, wherein said manually sensible area is a shallow-raised area.

42. The control structure of claim 40, wherein said manually sensible area is a shallow domed protrusion.

43. The control structure of claim 36, wherein said load is at least one dimmable light source.

44. The control structure of claim 36, wherein said control structure is a wall box structure adapted for mounting on a wall.

45. The control structure of claim 36, wherein said touch pad is substantially coplanar with said planar front surface.

46. The control structure of claim 36, wherein said touch pad is disposed in a plane parallel to and above the plane of said planar front surface.

47. A system for controlling power from a source to a load, comprising, in combination:
(a) a cover plate that has a front surface with a rectangular opening;
(b) a touch pad behind said rectangular opening having an accessible continuous surface area for providing a signal in response to pressure applied anywhere along said accessible continuous surface, the signal having at least one characteristic which is a function of the actual location on the area of said accessible continuous surface to which said pressure is applied;
(c) circuit means to adjust the power provided from said source to said load in accordance with said signal, wherein said circuit means includes an electronically adjustable voltage dividing means;
(d) a plurality of vertically arranged markers printed on said touch pad to serve as scale indicator;
(e) a plurality of status indicators coupled to said circuit means for illuminating respective discrete locations on said touch pad which lie on a line along the length of said touch pad and in a predetermined alignment with respective ones of said printed markers and being respectively illuminated adjacent the position on said touch pad at which said touch pad is touched by an operator;
(f) a small marker at the bottom of said touch pad and in the center of the width of said touch pad, the control electronics operable to toggle said load when said touch pad is touched at the location of said small marker; and
(g) at least a first status indicator connected to said control electronics and positioned to illuminate said small marker and when said touch pad is touched at said small marker to turn off said load.

48. The control structure of claim 47, wherein said control structure is a wall box structure adapted for mounting on a wall.

49. The system of claim 47, wherein said accessible continuous surface area of said touch pad is rectangular in shape.

50. The system of claim 49, wherein said accessible continuous surface area of said touch pad has a height of about 4 to about 6 times its width.

51. The system claim 50, wherein said rectangular shape has a height of about 5 times its width.

52. The system of claim 50, wherein said rectangular shape has a height of about twice its width.

53. The system of claim 47, wherein the plurality of status indicators comprise a plurality of LEDs.

54. The system of claim 53, wherein said plurality of LEDs consist of at least 7 blue LEDs.

55. The system of claim 53, wherein said discrete locations illuminated by said plurality of LEDs are disposed along one vertical edge of said touch pad.

56. The system of claim 53, wherein said discrete locations are vertically disposed along the center of the width of said touch pad and wherein said LEDs are blue LEDs.

57. The system of claim 47, further comprising:
a second status indicator of color different from that of said first status indicator, the second status indicator coupled to said control electronics and operable to illuminate said small marker when said touch screen is touched at any location.

58. The system of claim 53, wherein said LEDs are disposed beneath and are spaced from the bottom of said touch screen and further including light conductors extending from each of said LEDs to respective ones of said discrete locations behind said touch screen.

59. The system of claim 47, further comprising:
an airgap switch; and
an operator for said airgap switch, said operator including a lever having an end which extends only sufficiently through said cover plate at the bottom of said rectangular opening to be gripped by a fingernail of an operator.

60. The system of claim 47, wherein the area of said touch pad which is adjacent to the location of said marker is spaced from the lowermost one of the locations of said plurality of status indicators by a distance to tend to prevent the touching by a finger of both the location of said marker dot and the location of said lowermost LED.

61. The system of claim 60, wherein said control structure is a wall box structure adapted for mounting on a wall.

62. The system of claim 60, wherein said accessible continuous surface area of said touch pad is rectangular in shape.

63. The system of claim 60, wherein said accessible continuous surface area of said touch pad is rectangular in shape.

64. The system of claim 60, wherein said accessible continuous surface area of said touch pad has a height of about 4 to about 6 times its width.

65. The system of claim 60, further comprising:
a second status indicator of color different from that of said first status indicator, the second status indicator coupled to said control electronics and operable to illuminate said small marker when said touch screen is touched at any location.

66. The system of claim 60, further comprising:
an airgap switch; and
an operator for said airgap switch, said operator including a lever having an end which extends only sufficiently through said cover plate at the bottom of said rectangular opening to be gripped by a fingernail of an operator.

67. The system of claim 60, wherein said area of said touch pad between said marker and said lowermost location of said plurality of LEDs is deactivated and incapable of producing an output in response to a touch.

68. The system of claim 60, wherein said small marker comprises a small marker dot.

69. A system for controlling power from a source to a load, comprising, in combination:

(a) a cover plate that has a front surface with a rectangular opening;
(b) a touch pad behind said rectangular opening having an accessible continuous surface area for providing a signal in response to pressure applied anywhere along said area, the signal having at least one characteristic which is a function of the actual location on the area to which said pressure is applied;
(c) circuit means to adjust the power provided from said source to said load in accordance with said signal;
(d) said rectangular opening having a height about 4 to about 6 times its width; and
(e) a shallow raised area at the bottom of said touch pad, wherein depression of said raised area operates an on/off operation of said circuit means.

70. The system of claim 69, wherein said rectangular opening has a height of about 5 times its width.

71. The system of claim 69, which further includes a first status indicator positioned to illuminate said raised area.

72. A control structure for an electrical control system for producing a variable output electrical signal to an electrical load for controllably varying the output of said load, said control structure comprising:

(a) an enclosed volume which contains control electronics;
(b) a cover plate on one surface of said enclosed volume having a planar front surface and having a rectangular opening therein;
(c) a transparent touch pad disposed in said rectangular opening and coupled to said control electronics and adapted to produce an output signal which is related to the position within the area of said touch pad at which said touch pad is touched by an operator;
(d) a plurality of vertically arranged markers printed on said touch pad to serve as scale indicator; and
(e) a plurality of status indicators coupled to said control electronics for illuminating respective discrete locations on said touch pad which lie on a line along the length of said touch pad and in a predetermined alignment with respective ones of said printed markers and being respectively illuminated adjacent the position on said touch pad at which said touch pad is touched by an operator.

73. The control structure of claim 72, wherein said load is at least one dimmable light source.

74. The control structure of claim 72, wherein said control structure is a wall box structure adapted for mounting on a wall.

75. The control structure of claim 72, wherein said touch pad is substantially coplanar with said planar front surface.

76. The control structure of claim 72, wherein said rectangular opening has a height of about 4 to about 6 times its width.

77. The control structure of claim 76, wherein said rectangular openings has a light of about 5 times its width.

78. The control structure of claim 72, wherein said rectangular opening is a designer-style opening having a height which is about twice its width.

79. The control structure of claim 72, wherein the plurality of status indicators comprise a plurality of LEDs.

80. The control structure of claim 79, wherein said plurality of LEDs consist of at least 7 blue LEDs.

81. The control structure of claim 79, wherein said discrete locations illuminated by said plurality of LEDs are disposed along one vertical edge of said touch pad.

82. The control structure of claim 79, wherein said discrete locations are vertically disposed along the center of the width of said touch pad and wherein said LEDs are blue LEDs.

83. The control structure of claim 79, wherein said LEDs extend through said touch screen at said discrete locations.

84. The control structure of claim 79, wherein said LEDs are disposed beneath and are spaced from the bottom of said touch screen and further including light conductors extending from each of said LEDs to respective ones of said discrete locations behind said touch screen.

85. The control structure of claim 72, further comprising:
an airgap switch in said enclosed volume; and
an operator for said airgap switch, said operator including a lever having an end which extends only sufficiently through said cover plate at the bottom of said rectangular opening to be gripped by the fingernail of an operator.

86. A control structure for an electrical control system for producing a variable output electrical signal to an electrical load for controllably varying the output of said load, said control structure comprising:
(a) an enclosed volume which contains control electronics;
(b) a cover plate on one surface of said enclosed volume having a planar front surface and having a rectangular opening therein;
(c) a touch pad disposed in said rectangular opening and coupled to said control electronics and adapted to produce an output signal which is related to the position within the area of said touch pad at which said touch pad is touched by an operator;
(d) a plurality of status indicators coupled to said control electronics for illuminating respective discrete locations on said touch pad which lie on a line along the length of said touch pad; and
(e) and an audio circuit coupled to said touch pad for producing an audible sound in response to the touching of said touch pad and the illumination of any of said plurality of status indicators.

87. The control structure of claim 86, wherein said control structure is a wall box structure adapted for mounting on a wall.

88. The control structure of claim 86, wherein said rectangular opening has a height of about 4 to about 6 times its width.

89. The control structure of claim 86, wherein the plurality of status indicators comprise a plurality of LEDs.

90. The control structure of claim 89, wherein said plurality of LEDs consist of at least 7 blue LEDs.

91. The control structure of claim 89, wherein said discrete locations illuminated by said plurality of LEDs are disposed along one vertical edge of said touch pad.

92. The control structure of claim 89, wherein said discrete locations are vertically disposed along the center of the width of said touch pad and wherein said LEDs are blue LEDs.

93. The control structure of claim 89, wherein said LEDs extend through said touch screen at said discrete locations.

94. The control structure of claim 89, wherein said LEDs are disposed beneath and are spaced from the bottom of said touch screen and further including light conductors extending from each of said LEDs to respective ones of said discrete locations behind said touch screen.

95. The control structure of claim 86, further comprising:
an airgap switch in said enclosed volume; and
an operator for the airgap switch, said operator including a lever having an end which extends only sufficiently through said cover plate at the bottom of said rectangular opening to be gripped by the fingernail of an operator.

96. The control structure of claim 89, which further includes delay means coupled to said audio circuit for delaying the production of said audible sound for a predetermined time following the illumination of an LED.

\* \* \* \* \*